(12) United States Patent
Hondongwa et al.

(10) Patent No.: US 10,473,798 B2
(45) Date of Patent: Nov. 12, 2019

(54) COUNTING AND INTEGRATING PIXELS, DETECTORS, AND METHODS

(71) Applicants: Varex Imaging Corporation, Salt Lake City, UT (US); THE TRUSTEES OF DARTMOUTH COLLEGE, Hanover, NH (US)

(72) Inventors: Donald B. Hondongwa, Hanover, NH (US); Eric R. Fossum, Wolfeboro, NH (US)

(73) Assignees: Varex Imaging Corporation, Salt Lake City, UT (US); The Trustees of Dartmouth College, Hanover, NH (US)

( * ) Notice: Subject to any disclaimer, the term of this patent is extended or adjusted under 35 U.S.C. 154(b) by 0 days.

(21) Appl. No.: 15/625,932

(22) Filed: Jun. 16, 2017

(65) Prior Publication Data

US 2018/0364373 A1    Dec. 20, 2018

(51) Int. Cl.
| | |
|---|---|
| *G01T 1/20* | (2006.01) |
| *H04N 5/32* | (2006.01) |
| *H04N 5/378* | (2011.01) |
| *G01T 1/17* | (2006.01) |
| *H04N 5/3745* | (2011.01) |
| *H04N 5/347* | (2011.01) |
| *H01L 27/146* | (2006.01) |

(52) U.S. Cl.
CPC .............. *G01T 1/2018* (2013.01); *G01T 1/17* (2013.01); *H04N 5/32* (2013.01); *H04N 5/378* (2013.01); *H04N 5/3745* (2013.01); *H01L 27/14663* (2013.01); *H04N 5/347* (2013.01)

(58) Field of Classification Search
CPC ............ G01T 1/2018; G01T 1/17; H04N 5/32
See application file for complete search history.

(56) References Cited

U.S. PATENT DOCUMENTS

| | | | |
|---|---|---|---|
| 8,440,957 B2 | 5/2013 | Dierickx | |
| 2003/0080340 A1 | 5/2003 | Henderson | |
| 2008/0074524 A1* | 3/2008 | Panicacci | .......... H01L 27/14609 348/308 |
| 2008/0309800 A1* | 12/2008 | Olsen | ..................... H04N 5/357 348/241 |
| 2009/0033532 A1 | 2/2009 | Reshef | |
| 2011/0215222 A1* | 9/2011 | Eminoglu | ......... H01L 27/14634 250/208.1 |
| 2012/0061555 A1 | 3/2012 | Ay | |
| 2012/0138775 A1* | 6/2012 | Cheon | .................... H04N 5/361 250/208.1 |

(Continued)

OTHER PUBLICATIONS

Maj, "18k Channels Single Photon Counting Readout Circuit for Hybrid Pixel Detector," Nuclear Instruments and Methods in Physics Research Section A, 2013, pp. 32-39, Elsevier.

(Continued)

*Primary Examiner* — Hugh Maupin
(74) *Attorney, Agent, or Firm* — Laurence & Phillips IP Law

(57) ABSTRACT

Embodiments include a device, comprising: a column line; a plurality of pixels; each pixel coupled to the column line; a comparator having an input coupled to the column line and configured to compare a signal from the column line to a threshold; and control logic coupled to the pixels and configured to selectively couple each pixel to the column line after a sampling period for each pixel.

20 Claims, 14 Drawing Sheets

(56) References Cited

U.S. PATENT DOCUMENTS

| | | | |
|---|---|---|---|
| 2012/0305786 A1 | 12/2012 | Dierickx | |
| 2013/0032389 A1 | 2/2013 | Tokura | |
| 2015/0015757 A1* | 1/2015 | Willassen | H04N 5/378 348/308 |
| 2015/0303232 A1 | 10/2015 | Yamazaki | |
| 2015/0369929 A1 | 12/2015 | Durst | |
| 2017/0059721 A1* | 3/2017 | Simanovsky | G01T 1/2018 |

OTHER PUBLICATIONS

Freed, "A Fast, Angle-dependent, Analytical Model of CsI Detector Response for Optimization of 3D X-ray Breast Imaging Systems," Med. Phys. vol. 37, No. 6, Jun. 2010, pp. 2593-2605.

Ercan, "A High Frame Rate Hybrid X-Ray Image Sensor," IEEE Sensors Journal, vol. 15. No. 3, Mar. 2015, 1523-1531.

Xu, "Cascaded Systems Analysis of Photon Counting Detectors," Med. Phys. vol. 41, No. 10, Oct. 2014, pp. 101907:1-15.

Greskovich, "Ceramic Scintillators," Annu. Rev. Mater. Sci., 1997, vol. 27, pp. 69-88.

Barber, "Characterization of a novel photon counting detector for clinical CT: count rate, energy resolution, and noise performance," Medical Imaging 2009: Physics of Medical Imaging, vol. 7258, pp. 725824:1-9, 2009.

Kraft, "Counting and Integrating Readout for Direct Conversion X-ray Imaging: Concept, Realization and First Prototype Measurements," IEEE Transactions on Nuclear Science, vol. 54, No. 2, Apr. 2007, 383-390.

Åslund, Detectors for the Future of X-ray Imaging. Radiation Protection Dosimetry, Vo. 139, Issue 1-3, Apr. 1, 2010, Oxford University Press.

Danielsson, "Dose-Efficient System for Digital Mammography," Medical Imaging 2000: Physics of Medical Imaging, Proceedings of SPIE vol. 3977, 2000, 239-249.

Dierickx, Indirect X-ray Photon-Counting Image Sensor with 27T Pixel and 15e—rms Accurate Threshold, 2011 IEEE International Solid-State Circuits Conference, 2011, 114-116.

Ma, "Jot Devices and the Quanta Image Sensor," 2014 IEEE International Electron Devices Meeting, 2014, pp. 10.1.1-10.1.4 (247-250).

Masoodian, "Low-power Readout Circuit for Quanta Image Sensors," Electronics Letters, vol. 50, No. 8, 2014, pp. 589-591.

Fossum, "Modeling the Performance of Single-Bit and Multi-Bit Quanta Image Sensors," IEEE Journal of the Electron Devices Society, vol. 1, No. 9, Sep. 2013, pp. 166-174.

Campbell, "Readout for a 64×64 Pixel Matrix with 15-bit Single Photon Counting," 1997 IEEE Nuclear Science Symposium Conference Record, vol. 1, 1997, pp. 189-191.

Vedantham, "Solid-state Fluoroscopic Imager for High-resolution Angiography: Physical characteristics of an 8 cm×8 cm Experimental Prototype," Medical physics. 2004; 31(6), pp. 1462-1472.

Sallabriga, "The Medipix3 Prototype, a Pixel Readout Chip Working in Single Photon Counting Mode With Improved Spectrometric Performance," 2006 IEEE Nuclear Science Symposium Conference Record, vol. 6, 2006, pp. 3557-3561.

Taguchi, "Vision 20/20: Single Photon Counting X-ray Detectors in Medical Imaging," Med.Phys., vol. 40, No. 10, pp. 100901-1-19.

Search Report mailed in PCT/US2018/037939 dated Sep. 28, 2018.

Written Opinion mailed in PCT/US2018/037939 dated Sep. 28, 2018.

Search Report mailed in PCT/US2018/037939 dated Feb. 6, 2019.

Search Report mailed in PCT/US2018/037939 dated Jul. 12, 2019.

* cited by examiner

COUNTING AND INTEGRATING PIXELS, DETECTORS, AND METHODS

BACKGROUND

This disclosure relates to counting and integrating pixels, detectors, and methods of using the same.

X-ray imaging systems include an x-ray source and a detector. A specimen is placed between the source and the detector. The detector may directly or indirectly detect incident x-ray photons. Two main categories of detectors are current integrating detectors (CID) or energy integrating detectors (EID) and photon counting detectors (PCD). Some x-ray PCDs rely on continuous time current monitoring and pulse counting implementation of photon counting. Each pixel typically contains a pulse shaping circuit along with a thresholding system connected to a counter. This either dramatically reduces the fill factor of the pixel or necessitates the use of overlaid photodiodes using exotic materials like cadmium telluride (CdTe) or cadmium zinc telluride (CdZnTe or CZT). The resolution of the system is also limited by the need to accommodate all the circuitry.

When complementary metal-oxide-semiconductor (CMOS) photodiodes are used for photon counting, a continuous time current pulse monitoring approach is used. The pixel in such a system requires a large amount of circuitry to achieve photon counting. This limits the fill factor of a pixel and thus the counting capability of the pixel. In addition, the spectral capabilities of the sensor are limited by the available space, as the circuitry for each additional energy bin is placed in the pixel.

DETAILED DESCRIPTION

X-ray imaging is a popular medical imaging modality allowing for non-invasively viewing the internal structure and functioning of organisms. The penetrating power of x-rays makes them invaluable for such applications, but over exposure to the x-rays can harm a patient or provide additional health risks. As a result, there is a need for a lower dose per image to reduce patient exposure to the ionizing radiation while still providing high quality images. X-ray PCDs provide high quality images in low dose rate situations, like fluoroscopy.

Image sensors can be categorized according to how they account for the x-ray photons in pixels with two main categories being PCDs and integrating detectors such as CIDs and EIDs. A pixel can be a smallest addressable element in display or sensor array, such as two-dimensional (2D) array includes rows and columns. In a display, a pixel can emit energy, such as visible light from a light emitting diode (LED). In a sensor, the pixel can sense energy, such as photons from an energy source using a photoelectric conversion device, such as a photodiode. The pixel value in a CID is proportional to the time integral of the photoelectric current generated a result of the photon absorption in the sensor, which is often used in relatively high dose single-frame radiographic imaging. In contrast, the PCDs produces a pixel value that is proportional to the photon count incident on the detector, which can be used in relatively low dose multiple-frame (e.g., video) fluoroscopic imaging. In x-ray imaging, photon counting aims to quantify the number of x-ray quanta received by the sensor. The description below illustrates examples of x-ray quanta image sensors (XQIS) utilizing temporal oversampling, CMOS image sensor technology for photon counting, and combined integrating and counting sensors.

Figure 1A:
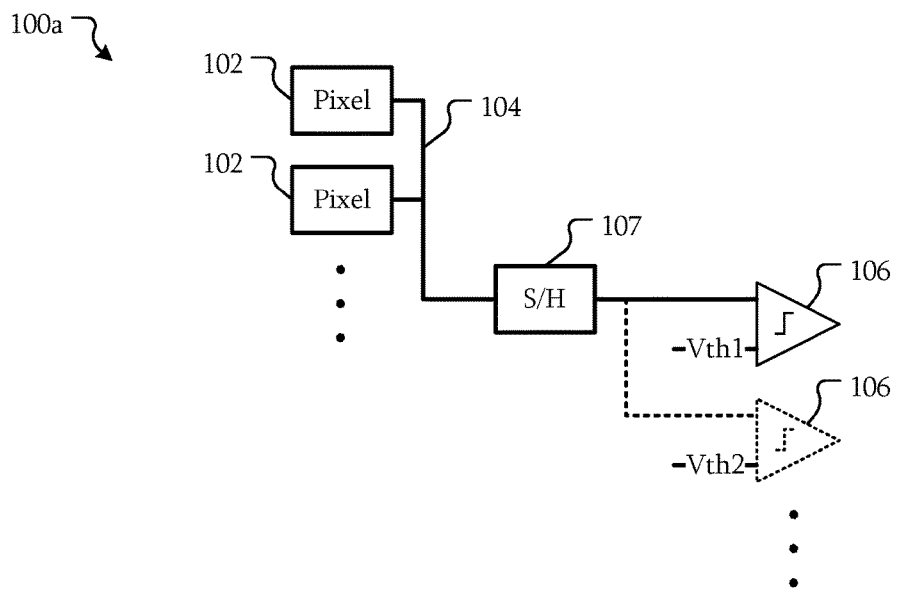
FIGS. 1A-1B are block diagrams of columns of detectors according to some embodiments.
Figure 1B:
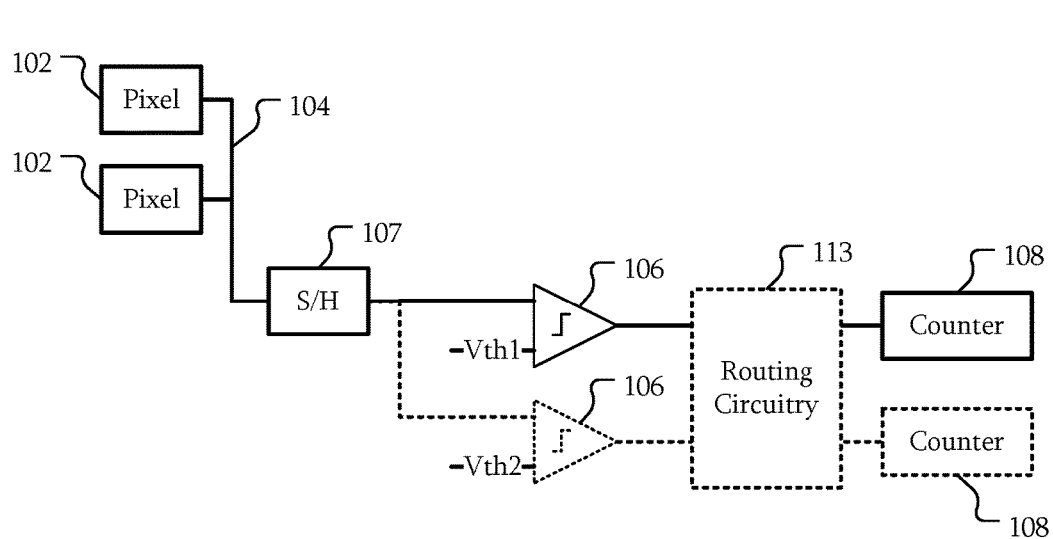

FIGS. 1A-1B are block diagrams of columns of detectors according to some embodiments. Referring to FIG. 1A, in some embodiments, a detector includes multiple columns 100a of pixels. Here one column 100a is illustrated as an example. The column 100a includes multiple pixels 102. Each pixel of the column 100a is coupled to a column line 104. Each pixel 102 is configured to output a signal, such a signal representative of the energy from one or more photons, to the column line 104.

The column line 104 is coupled to inputs of at least one comparator 106. In some embodiments, only one comparator 106 is included in the column 100a circuitry; however, in other embodiments, more comparators 106 may be present. Each comparator 106 is configured to compare an input signal with a corresponding threshold and output a result of the comparison. Using two comparators 106 as an example, the thresholds for the corresponding comparators are represented by thresholds Vth1 and Vth2. In some embodiments, each of the thresholds associated with the comparators 106 is different from the others. In some embodiments, a reference voltage may be divided by a resistive divider to generate the threshold voltages. In some embodiments, the threshold voltages may be evenly separated; however, in other embodiments, the threshold voltages may be separated by differing amounts. In some embodiments, the comparator 106 can be replaced by an analog-to-digital converter (ADC) that can be used to perform the thresholding.

In some embodiments, a sample and hold circuit (S/H) 107 may be coupled to the column line 104. The S/H 107 is configured to sample and hold a signal present on the column line 104. In particular, the S/H 107 is configured to sample and hold an output of a pixel 102 that is selectively coupled to the column line 104. Accordingly, the held signal from the column line 104 may be compared to the thresholds by the comparators 106. The comparators 106 may be coupled to the column line 104 through the S/H 107. In some embodiments, other circuitry, such as a column amplifier, is coupled to the S/H 107 before the comparators 106.

Circuitry such as the comparators 106, the S/H 107, and/or threshold generation and distribution circuitry are shared among a column 100a and not disposed in each pixel 102. As a result, the pixel 102 array design may be simplified, the pixels 102 may occupy less area, the fill factor may be increased, or the like.

Referring to FIG. 1B, in some embodiments, column 100b includes components similar to column 100a. The dots representing additional components from FIG. 1A are omitted for clarity. Each of the comparators 106 is coupled with a corresponding one of the counters 108. The counters 108 are circuits configured to increment a value in response to an input signal from the corresponding comparator 106. Accordingly, the counters 108 may be configured to count a number of times the signal on the column line 104 has passed the threshold of the corresponding comparator 106, which may represent one or more incident photons. Similar to the sharing of circuitry in the column 100a of FIG. 1A, the pixels 102 share the counters 108. Thus, the amount of circuitry in a pixel 102 may be further reduced.

In some embodiments, the counters 108 may be implemented on a pixel-by-pixel basis. For example, the counters 108 may be implemented with counting logic and a memory location for each pixel. Routing circuitry 113 is coupled between the comparators 106 and the memory. The routing circuitry 113 includes circuitry that can direct the output(s) of the comparator(s) 106 to increment an appropriate memory location. For example, when a pixel 102 at a particular row and column outputs a signal to the column line 104, the signal is compared to a threshold by a comparator 106. The comparison result is routed by the routing circuitry 113 to increment the memory location associated with the particular pixel 102. When multiple comparators 106 and thresholds are used, each pixel 102 may be associated with multiple memory locations based on the number of thresholds. For example, with an m×n array of pixels and j thresholds, m×n×j memory locations may be used as part of the counters 108.

In some embodiments, the memory locations and counting logic of the counters 108 may be implemented on a monolithic integrated circuit including the pixels 102. However, in other embodiments, the counters 106 may be external to such a monolithic integrated circuit. Regardless, the circuitry is outside of the pixels 102 themselves. Thus, the circuitry has little impact the fill factor of the pixels 102.

Figure 1C:
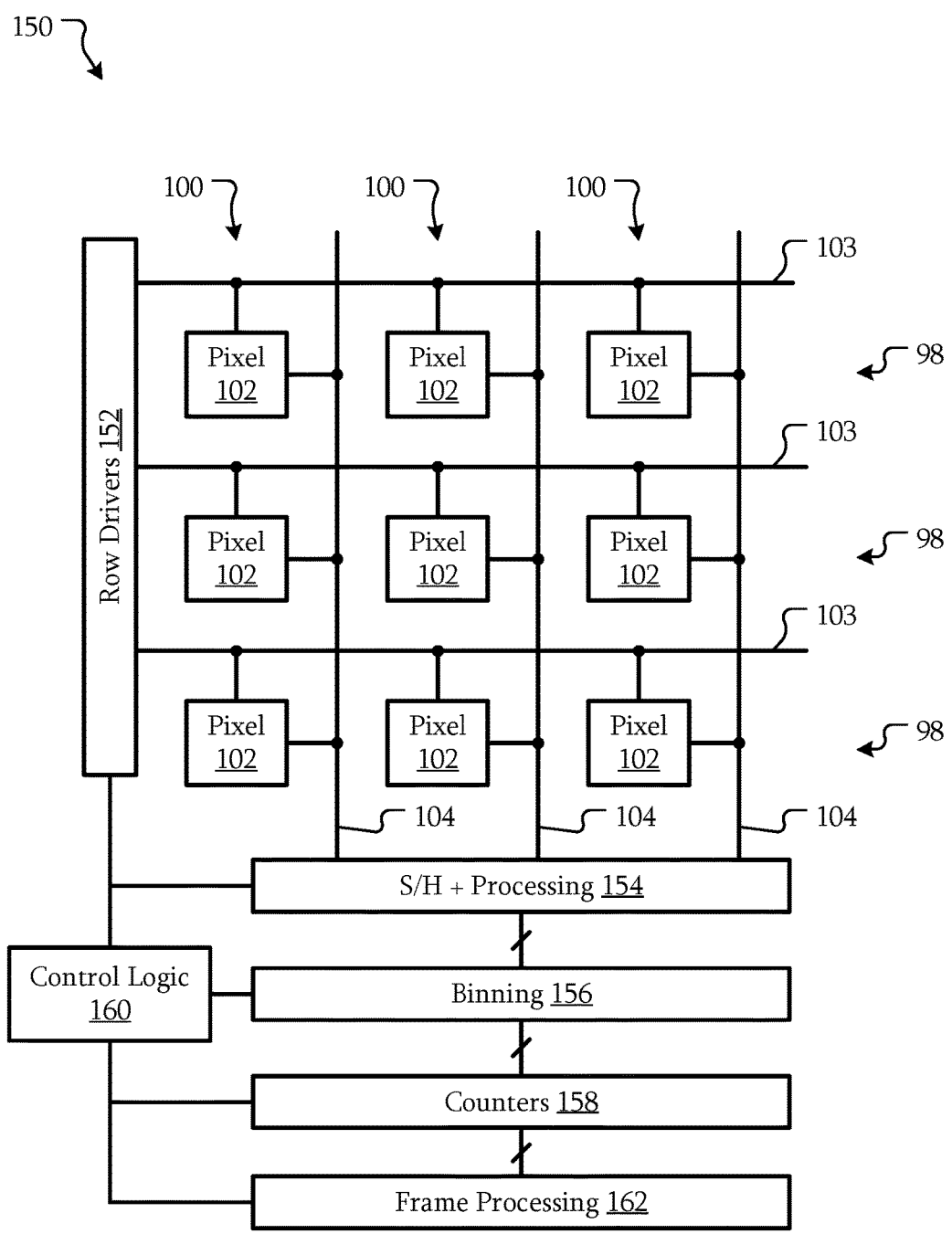
FIG. 1C is a block diagram of a 3×3 detector according to some embodiments.

FIG. 1C is a block diagram of a 3×3 detector according to some embodiments. In other examples, the detector can be an m×n with m rows and n columns. Referring to FIG. 1C, a detector 150 includes pixels 102 arranged in columns 100 and rows 98. The pixels 102 and columns 100 may be similar to the pixels 102 and columns 100a and/or 100b, or the like. The pixels 102 are coupled to a row driver 152 configured to selectively couple the pixels 102 to the column lines 104 using row select lines 103. Although row select lines 103 have been used as an example of control lines coupled between the pixels 102 and the row driver 152, the row driver 152 may include other control lines.

The column lines 104 are coupled to the S/H and processing circuitry 154. The S/H and processing circuitry 154 may include the S/H 107 described above. The S/H and processing circuitry 154 may also include other circuitry to control multiple S/H 107, condition the signals from the column lines 104, or the like.

The binning circuitry 156 for energy or signal binning is coupled to the S/H and processing circuitry 154. The binning circuitry 156 may include the comparators 106 described above. In addition, the binning circuitry 156 may include threshold generation circuitry, threshold voltage distribution circuitry, reference voltage circuitry, or the like.

The counter circuitry 158 is coupled to the binning circuitry 156. The counter circuitry 158 may include the counters 108 described above. In some embodiments, the counter circuitry 158 includes the memory and counting logic described above.

The control logic 160 is coupled to the row driver 152, the S/H and processing circuitry 154, the binning circuitry 156, and the counter circuitry 158. The control logic 160 is configured to control the operations of these circuits and potentially other circuits to control operation of the detector 150.

Accordingly, in some embodiments, the readout of the pixel 102 values may be performed in a column parallel manner. The binning and counting may also be performed in a column parallel manner. In some embodiments, a global shutter readout may be performed while in other embodiments, a rolling shutter readout may be performed. In a global shutter readout, all the pixels 102 for a frame or image are exposed at a particular instant in time. The pixels 102 may be read in parallel, sequentially in rows 98, or the like. Rolling shutter readout is a method of exposing and reading by scanning across an array, either vertically or horizontally. In some embodiments, a column parallel rolling shutter readout is used where the column share processing circuitry and each row 98 is read out one at a time.

In some embodiments, the detector 150 may be part of an x-ray imaging detector. Using a detector 150 and/or the columns 100 described herein, the detector 150 may be configured to simultaneously count x-ray photons, perform energy binning processing on those photons, and/or perform current integration. As will be described below, in some embodiments, such operations may be performed using CMOS photodiodes in the pixels 102. In some embodiments, the use of exotic material photodiodes (e.g., CdTe or CZT; non-CMOS materials) may be eliminated by using CMOS technology. In some embodiments, a scintillator may be used in an indirect imaging technique. A scintillator includes a luminescent or scintillation material which generates visible light when excited by ionizing radiation, such as x-rays (i.e., converts x-ray photons to light).

In some embodiments, the control logic 160 may be configured to control the detector 150 to perform a discrete-time photocurrent integration. In particular, by controlling the integration and sampling time, the chance that no photons or one photon is incident on a pixel 102 per given time frame can be increased. In some embodiments, the sampling time is set such that the probability that only one photon was incident onto the pixel 102 is relatively high. As a result, the integrated current in that frame, if large enough, is from only one photon. For example, by setting the threshold between an expected amount of current from a lowest-expected energy photon, and the expected amount of spurious current, the photon may be distinguished from the noise and counted.

In some embodiments, the photon arrival at the detector surface follows a Poisson probability distribution in time.

Given an average number of photons per pixel per unit time (λ) the probability that k photons are incident on the detector in some fixed amount of time t is illustrated by Equation 1.

$$Pr(X = k) = \frac{(\lambda t)^k e^{-\lambda t}}{k!} \quad \text{(Equation 1)}$$

Figure 1D:
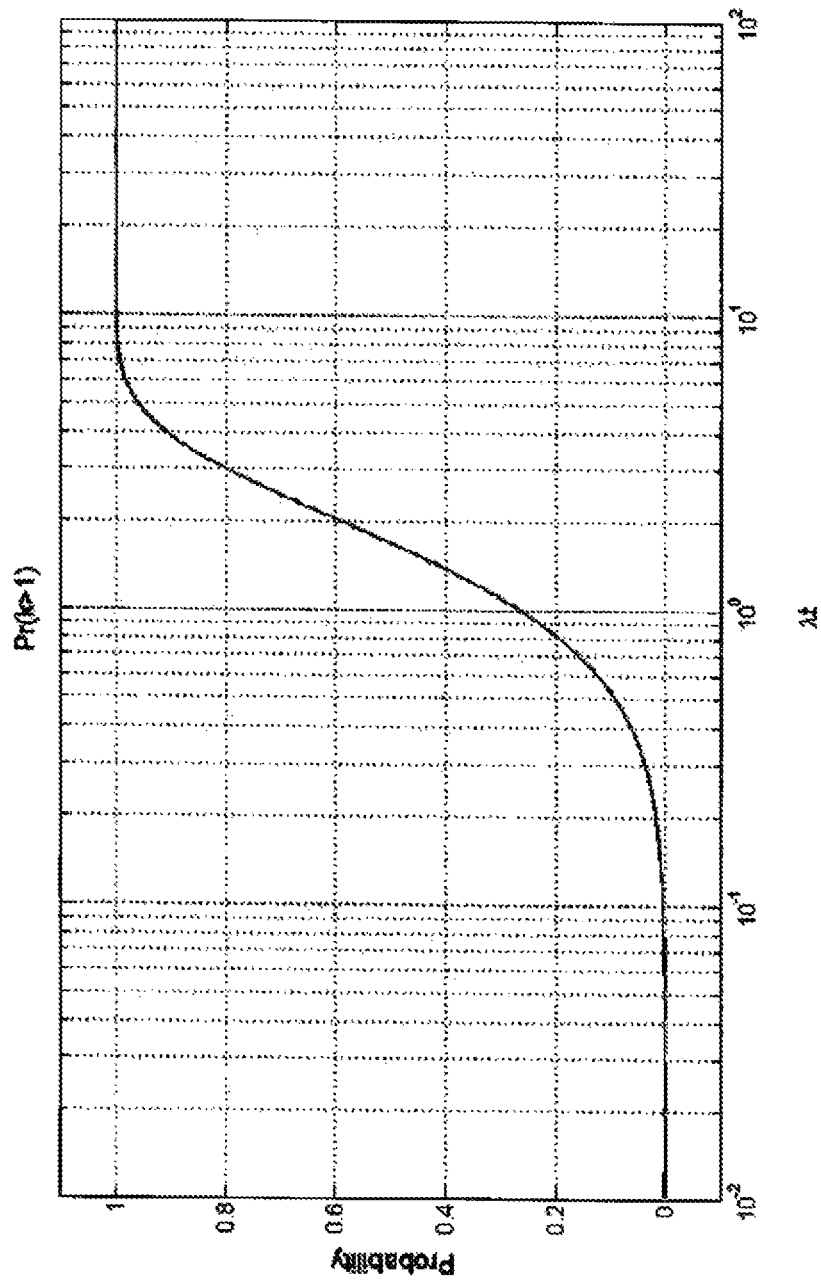
FIG. 1D is a graph illustrating a probability that more than one photon is incident according to some embodiments.

FIG. 1D is a graph illustrating a probability that more than one photon is incident according to some embodiments. In particular, the graph illustrates the probability of more than one photon (k>1) is incident versus the product of λ and t. The probability of multiple events falls as the sampling period t is reduced. By sufficiently reducing the sampling period, the average number of x-ray photons arriving per pixel per frame is much less than one. Thus, the probability of multiple photons arriving per pixel per frame may be much less than one. As a result, the probability of multiple counts in one frame may be relatively low. In other words, by oversampling in time the detector 150 can generate an accurate photon count.

Figure 1E:
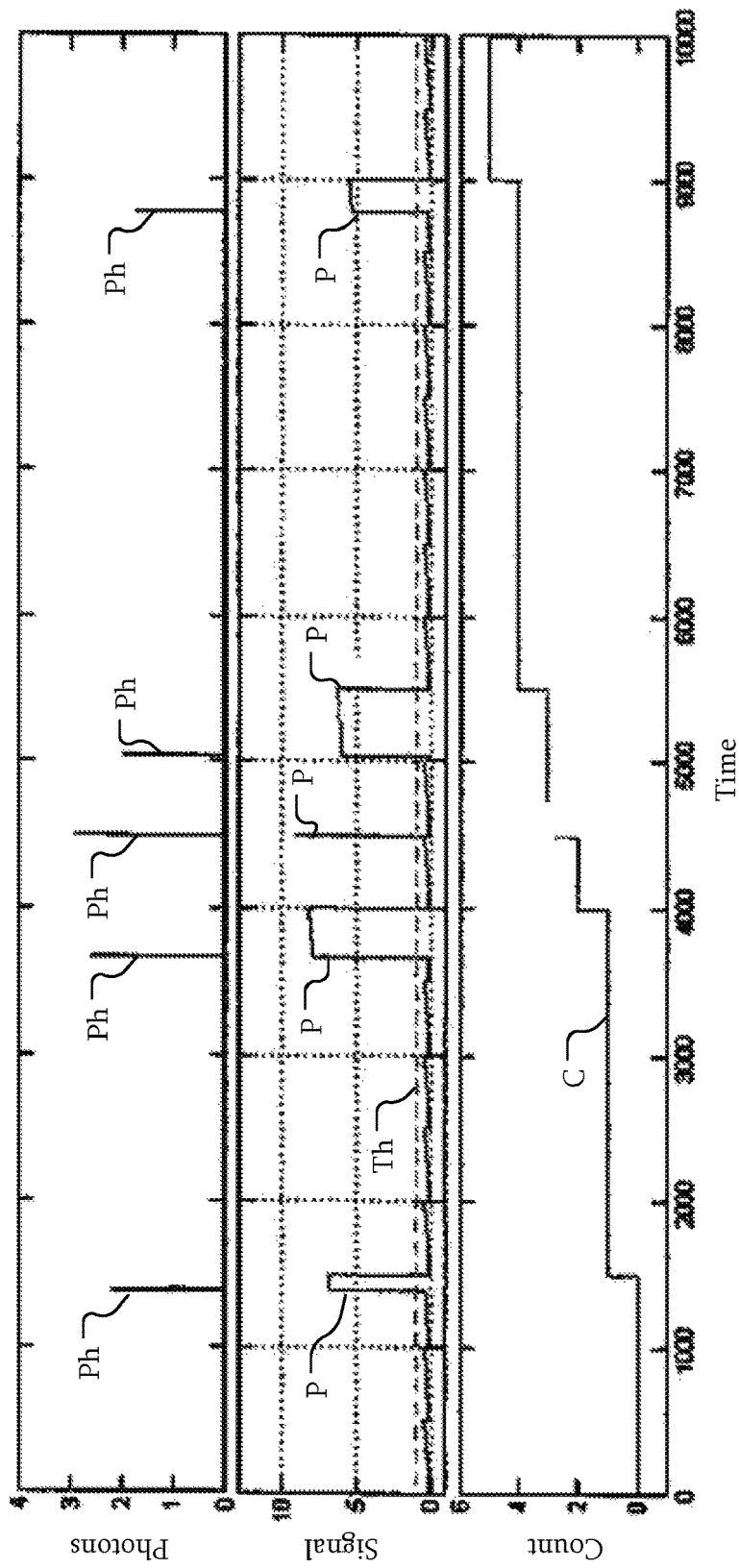
FIG. 1E includes graphs illustrating incident photons and processed signals according to some embodiments.

FIG. 1E includes graphs illustrating incident photons and processed signals according to some embodiments. Referring to FIG. 1E and using FIGS. 1A-C as an example, in some embodiments, when an x-ray photon is absorbed by a pixel 102 it will generate electron-hole pairs in the pixel 102. This manifests as a current pulse in the pixel 102. The pulses Ph in the "photons" graph (top graph) illustrate the photon arrival. Using discrete time pulse integration, the current pulse is integrated in the pixel 102 and the pixel value P is read after a fixed amount of time set by the sampling period. Here, a sampling period of 500 is used as an example. No units are given as this is an example. The actual sampling period would be based on the average number of photons per pixel per unit time as described above.

The "signal" graph (middle graph) illustrates the pixel value, which reflects the amount of the integrated charge. The pixel 102 value includes pulses P resulting from integrating of a charge due to a corresponding photon Ph. The pixel 102 value is reset at the beginning of each time frame. Here, that is every 500 units. The examples of incident photons generating the current pulses in the "photons" graph are selected to illustrate different times of incidence of the photons relative to the reset of the pixel 102 value.

An event is assumed to have occurred if the pixel 102 value is above the threshold value at the end of each frame. Here, the dashed line Th at approximately 1.5 on the "signal" graph is an example of a threshold.

The "count" graph (bottom graph) illustrates the output of a counter 108 over time. The count C increases when at the end of the sampling period, the pixel 102 value is greater than the threshold. For example, the output of the pixel 102 is applied to the column line 104. The signal on the column line is sampled and held in the S/H 107. The held value is compared with a threshold, such as Vth1. The result is used to update the counter 108.

Although only one threshold and one counter 108 are used as an example in the graphs of FIG. 1E, in other embodiments, multiple thresholds, multiple comparators 106, and multiple counters 108 may be used as described above.

In some embodiments, a photoelectric conversion device of a pixel 102 need not be continuously monitored to determine if an event has occurred. Instead the pixels 102 are interrogated at the end of a fixed time frame. As a result, the circuitry within a pixel 102 that would have been used to continuously monitor a photoelectric conversion device may be omitted. This circuitry that would have been present in a conventional PCD would have reduced the fill factor of the pixel.

Moving circuitry out of the pixel 102 and the lack of other circuitry in each pixel 102, such as the monitoring circuitry described above, increases the fill factor, allow the use of a monolithic integrated photoelectric conversion device, such as a CMOS photodiode, in the pixel 102. In other words, because the fill factor of the pixel was increased by moving or eliminating circuitry present in conventional pixels, sufficient space is available to use a monolithic integrated photoelectric conversion device in the pixel 102.

Accordingly, additional designs and operations used in conventional PCD fabrication may be eliminated. For example, a separate photoelectric conversion device may be needed to offset the low fill factor of a conventional pixel. The photoelectric conversion device would be separately bonded to the conventional pixel. By increasing the fill factor as described above, a separate photoelectric conversion device is not necessary. As a result, fabrication costs and complexity may be reduced. An additional part and additional fabrication steps are not needed as the photoelectric conversion device is integrated in the pixel 102.

In some embodiments, the amount of charge generated by each x-ray event is proportional to the energy of the incoming x-ray. By discriminating the collected charge on the basis of total charge into different bins, the detector 150 can generate energy information. As described above, each pixel 102 may share multiple thresholds and counters. Sharing the comparators 106 and counters 108 allows for additional comparators 106 and counters 108 to be used without increasing the size of a pixel 102. In some embodiments, an additional threshold level uses only an additional comparator 106 and counter 108 for each column. An additional comparator 106 and counter 108 are not added to each pixel 102.

In addition, as described above, the timing of the sampling period may be set such that the probability of a detected photon is a single photon is relatively high. Accordingly, the comparison of the value read from a single pixel 102 may be proportional to the integrated energy of a single photon. By comparing that value to multiple thresholds, the energy of the single photon may be categorized as being in one of multiple energy ranges or bins. In some embodiments, energy resolution may be used for correcting the energy weighting of the imaging and in dual energy imaging; however, in other embodiments, the energy resolution may be used differently.

In some embodiments, when the detector 150 is part of an x-ray imaging system, the detector 150 and, in particular, the pixel 102 structure and sampling technique may improve the quality of detected information. For example, in some applications, a specimen is placed between the x-ray source and the detector 150. The x-ray source produces a spectrum of energies determined by the voltage and current settings of the x-ray source and any added filters. As the x-rays pass through the specimen they will be attenuated as they are absorbed by the specimen. The level of attenuation depends on the energy of the x-rays and the composition of the matter the x-rays are passing though; for example, bone will attenuate the beam more than soft tissue.

Some detectors generate an intensity map of the transmitted photons to as the image. In particular, this image is formed from the generated signal at each pixel which is proportional to the number of x-ray photons absorbed by the pixel multiplied by the energy of each respective photon. The images are weighted towards the high energy end of the spectrum because the high energy photons have a higher chance of being transmitted through the specimen and will produce a proportionally higher signal in the detector.

In particular, the x-ray spectrum will be attenuated more on the lower energy end because lower energy x-ray photons have a higher absorption coefficient. This means that the transmitted x-ray beam may have a different intensity and spectrum compared to the incident photons after passing through a uniform specimen. As a result, when a non-uniform specimen is tested, the source of the attenuation may be ambiguous as the cause of attenuation in the signal may be the result of low energy photons or a lower photon flux reaching the detector.

However in some embodiments, photon counting instead counts the number of incident photons. This may have a better energy weighting and may improve the diagnostic quality of resulting images. Instead of simply integrating the signal over time, photon counting enables identifying and counting the number of x-ray photons absorbed by each pixel 102. An image can thus be formed based on a grayscale value calculated from the number of photons. In this scenario, each photon contributes equally to the image thus providing better energy weighting because the greyscale values are now independent of the absorbed x-ray photon energy, improving the diagnostic quality of the final image.

In some embodiments, photon counting can also be accompanied by energy binning based on the signal magnitude as described above. This allows for the recovery of the x-ray energy information. This not only allows for a more flexible energy weighting policy but also enables the detector 150 to perform additional operations such as spectrographic imaging and contrast enhancements, for example.

In some embodiments, the detector 150 includes frame processing circuitry 162. The frame processing circuitry 162 is configured to perform operations on a frame basis. In particular, the frame processing circuitry 162 may be configured to perform image correction and image processing algorithms, such as those that improve the image quality. The information from intermediate frames can be stored for further processing before the outputting a final image.

In particular, because of the row by row readout (column parallel readout), frame data correction algorithms is usually implemented after the thresholding and counting occurs. In some embodiments, a centroid detection algorithm may be performed, which can be used to correct for the charge sharing effect due to phosphor blur. Correcting for charge sharing may help not only improve the spatial resolution but the energy resolution as well. For example, charge sharing may occur when a scintillation signal from one x-ray photon is spread among multiple pixels reducing spatial resolution. This has the effect of blurring the image, and since the signal charge is divided among multiple pixels. In addition, the x-ray energy is divided among multiple pixels, thus introducing error in the energy counts and reducing energy resolution.

A winner-take-all centroid detection may be implemented over a window, such as over a 3×3 pixel neighborhood, before the thresholding for example. The winner-take-all centroid detection is a process of assigning a signal charge divided among multiple pixels to a pixel with the highest energy. For example, in a 3×3 group of pixels 102, the pixel 102 with the largest signal may be assumed have to contain the center of incidence of an x-ray photon and the signals from neighboring pixels may be assumed to be overflow. The overflow may be disregarded, reassigned to the pixel 102 with the biggest signal, or the like. This approach is enabled by operating the detector 150 with a sampling period that results in the photon incidence rate being low so that the probability of two neighboring pixels being hit at the same time is small. In other embodiments, alternate approaches may be used to process the frames. For example, a Gaussian fitting algorithm may be applied to each frame to extract the x-ray photon incidence location and the charge spread to neighboring pixels. The Gaussian fitting algorithm is the process of constructing a curve, or mathematical function, with Gaussian symmetric "bell curve" shape that has the best fit to a series of data points.

The frame processing 162 may be configured to generate a final image. In some embodiments, the pixel 102 value is compared to a set threshold to approximate the energy bin of the original x-ray pixel. If the pixel value exceeds the threshold, then a counter 108 is incremented. A final image will can be formed by combining the frames. In some embodiments, the frames are simply added to each other. The total count can be used as the grayscale value of the image. In some embodiments, if multiple energy bins are implemented, the energy bins may be used as different color channels. The image can thus be displayed in any of the conventional image formats like JPEG, BMP, TIFF, or the like.

Although the detector 150 has been described as having particular circuitry and being configured to perform particular operations, in other embodiments, the detector 150 or other detectors described herein may include additional and/or different circuitry and may be configured to perform additional and/or different operations.

Figure 1F:
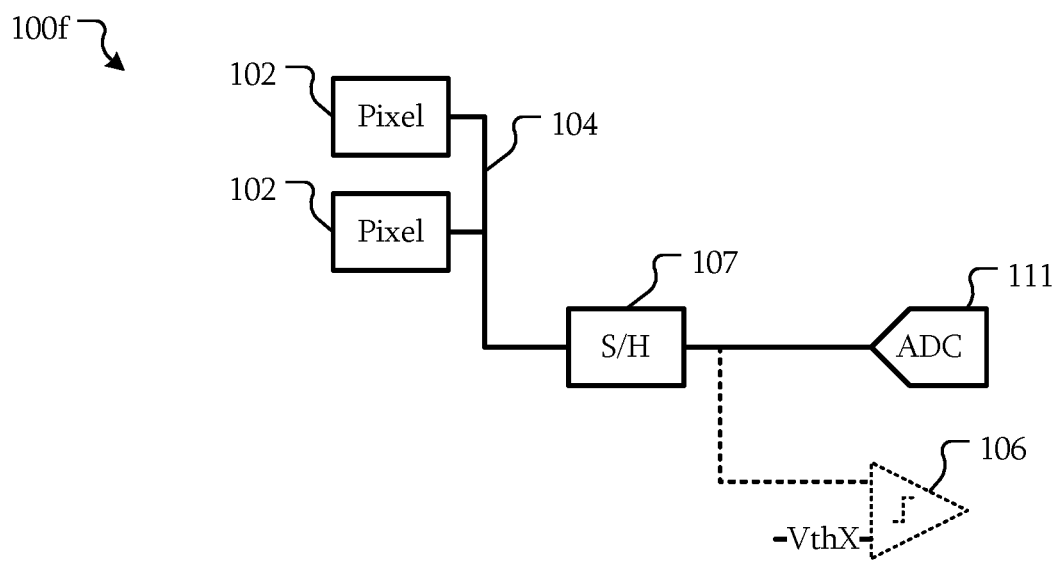
FIG. 1F is a block diagram of a column of a detector according to some embodiments.

FIG. 1F is a block diagram of a column of a detector according to some embodiments. The column 100f includes component similar to the column 100a described above. However, the column 100f includes an analog-to-digital converter (ADC) 111 configured to convert an analog signal into a digital signal. In some embodiments, the ADC 111 may be used to perform the thresholding described above.

In some embodiments, digital signal integration may be performed to supplement the thresholding/counting described above. That is, in some embodiments, the ADC 111 is included in the column 100f in addition to one or more comparators 106 as described above. In a particular example, digital signal integration may be used if the x-ray photon incidence rate is higher than what the detector 150 can count effectively. For example, a number of incident photons in a sampling time may be greater than one. In such cases, the photon count may be corrupted, but the pixel 102 value still reflects the total current generated in each frame. That is, while a pixel 102 value may be erroneously interpreted as a single photon, the pixel 102 value may still accurately represent the energy of the multiple photons. The ADC 111 may digitize the pixel 102 value into a digital value representing the energy of the multiple photons. The digitized value for the pixel 102 may be integrated over multiple frames. Combining the frames will result in an image similar to a conventional intensity map. Such an implementation would extend the working dynamic range of the sensor to beyond its counting dynamic range. That is, for lower intensity levels, the improved performance described herein may be realized using the photon counts; however, for higher intensity levels, the detector 150 may still operate and provide a result similar to a conventional current integrating sensor.

Figure 1G:
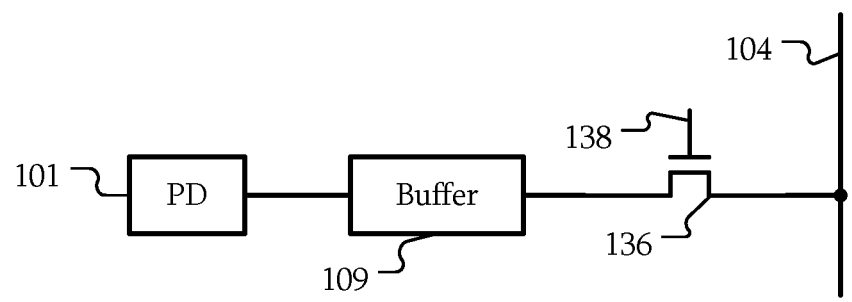
FIGS. 1G-1H are block diagrams of pixels according to some embodiments.
Figure 1H:
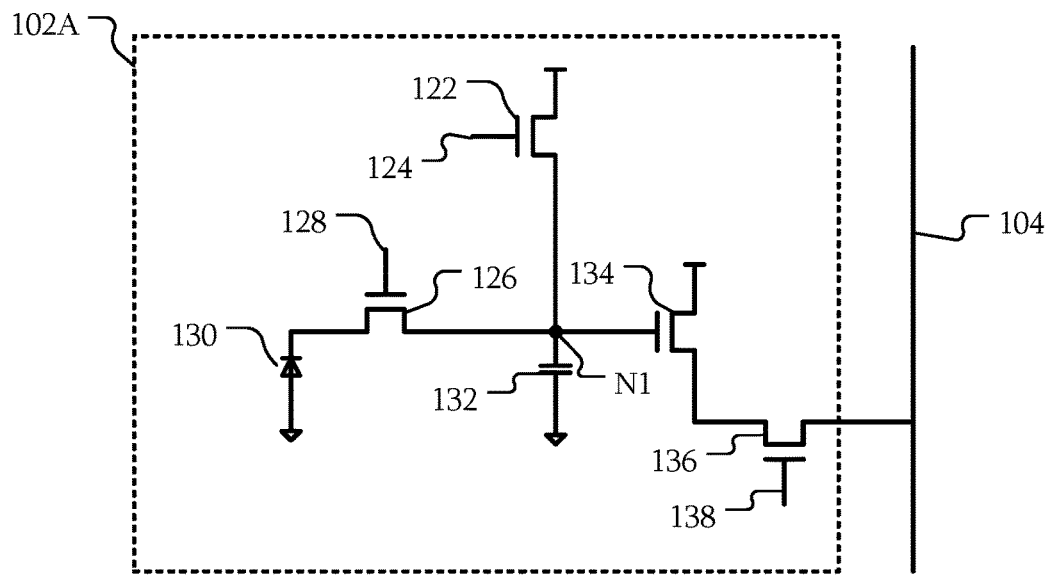

FIGS. 1G-1H are block diagrams of pixels according to some embodiments. Referring to FIG. 1G, in some embodiments, a pixel 102 includes a photoelectric conversion device (PD) 101 and a readout transistor 136. The PD 101 is coupled to the column line 104 through the readout transistor 136.

The PD 101 includes devices configured to convert photons to electrical charges. For example, a PD 101 may include a photodiode, phototransistor, a photoconductor, a photogate, or the like. In particular, the PD 101 may include a CMOS photodiode integrated in a monolithic circuit with other circuitry described herein.

The readout transistor 136 is configured to receive a readout control signal 138. In response to the readout control signal 138, the readout transistor 136 is configured to selectively couple the PD 101 to the column line 104. For example the readout control signal 138 may be row select signal from a row decoder or row driver as described above.

In some embodiments, the pixel 102 may include a buffer 109. The buffer may be a unity gain buffer; however, in other embodiments, the buffer 109 may have a non-unity gain. In particular examples, the buffer 109 may include a source follower, an emitter follower, or the like.

FIG. 1H is an example of a four transistor (4T) pixel that includes a photodetector (a pinned photodiode) 130, a storage capacitor 132, a transfer gate (transfer transistor) 126, reset gate (reset transistor) 122, source-follower transistor 134, and readout transistor 136. Each transistor 122, 126, 134, and 136 may have a similar structure and the names of the transistors are used to assist with the identification of the transistor. A pixel 102A is an example of a pixel configuration that may be used in pixel 102. In other examples, a different pixel configuration may be used in pixel to perform the functions described. The pixel 102A may include a photodiode 130. The photodiode 130 is coupled to a storage capacitor 132 at node N1 through a transfer transistor 126. The transfer transistor 126 is configured to selectively couple the photodiode 130 to the storage capacitor 132 in response to a transfer control signal 128. In some embodiments, the storage capacitor 132 is a floating diffusion (FD) capacitor; however, a different capacitor may be used in different embodiments. A floating diffusion capacitor refers to a capacitor that is selectively not connected directly to any controlled voltage nodes so one node is electrically isolated from other controlled voltage nodes using a p-n junction forming a quasi-neutral diffusion region that is not fully depleted.

A reset transistor 122 is coupled to the node N1. The reset transistor 122 is coupled to a voltage, such as a reference voltage, a supply voltage, or the like. The reset transistor 122 is configured to selectively couple the voltage to the node N1 in response to a reset control signal 124. For example, the reset transistor 122 may be used to reset a pixel 102 after sensing.

A source-follower transistor 134 is coupled to node N1. The source-follower transistor 134 is configured in a follower configuration. For example, in a CMOS process, the source-follower transistor 134 may be a source follower. The source-follower transistor 134 may operate as the buffer 109. Although one source-follower transistor 134 has been used as an example of a buffer 109, in other embodiments, the buffer 109 may include more transistors and/or other components.

Readout transistor 136 is coupled to the source-follower transistor 134. The readout transistor 136 may be configured to operate similar to that of FIG. 1E. That is, the readout transistor 136 may selectively couple an output of the source-follower transistor 134 to the column line 104.

In some embodiments, the pixel can operate as a photon counting system using the frame based, high speed counting technique. For example, the pixel may be operated similar to a 4T pixel. Charge integrated during the sampling period, as described above, is read out to the storage capacitor 132 and node N1. The node N1 may be subsequently read out through the column line 104 to the S/H 107 for comparison to one or more thresholds. Because of the column-based sample/hold, comparison, and counting, the pixel uses less components, simplifying the design and reducing the pixel size. Moreover, using a source follower 134 in the readout path allows the system to operate at higher speeds in excess of 1000 frames per second (fps) to improve the counting accuracy, and has a high conversion signal gain for improved noise performance. The signal from the source follower 134 can be binned using one or more thresholds that, as described above, may correspond to different x-ray energies. With the appropriate selection of threshold voltages, the output of the counters will correspond to the photon counts for each energy level.

Figure 2A:
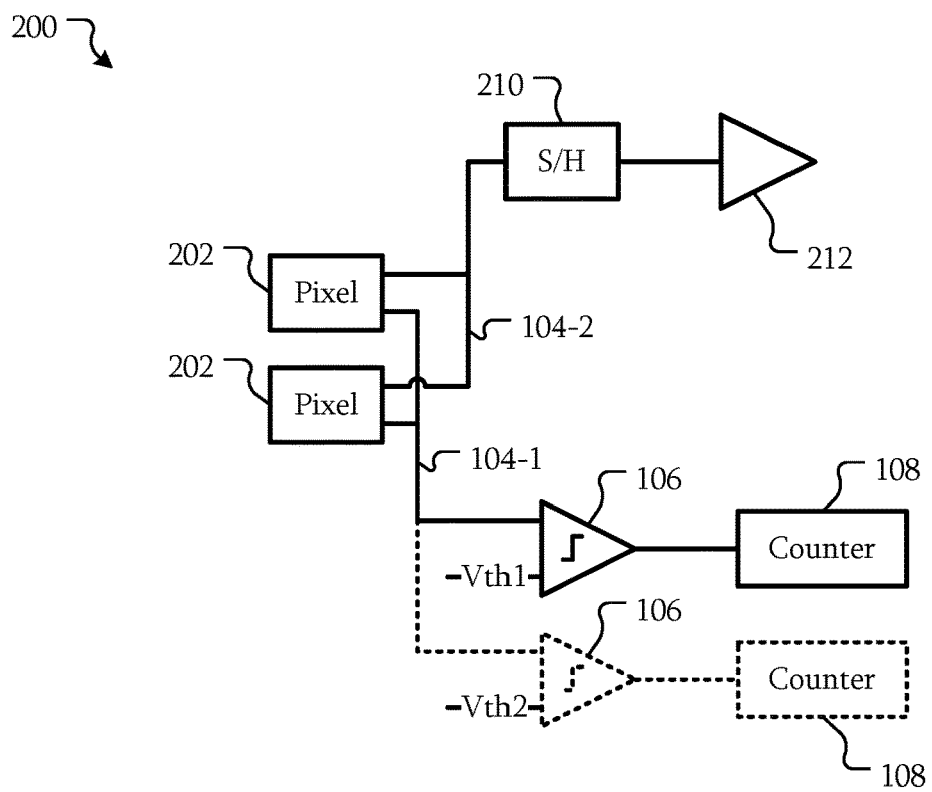
FIG. 2A is block diagram of a column of a detector according to some embodiments.

In some embodiments, pixels as described can support current integration used in a CID and photon counting used in a PCD in the same detector. The operation of such a detector can be dynamically adapted to multiple modes of imaging including both low dose applications, such as fluoroscopic imaging, and high dose application, such as radiographic imaging. FIG. 2A is block diagram of a detector according to some embodiments. In some embodiments, the column 200 of a detector may be similar to that of FIGS. 1A-1B. However, the pixels 202 of a column 200 are coupled to two column lines 104-1 and 104-2. Column line 104-1 is coupled to an S/H 107, comparators 106, and counters 108 similar to a column 100; however, column line 104-2 is coupled to an S/H 210 and a buffer 212. As will be described in further detail below, values output to the second column line 104-2 may be values that have been integrated over a time period greater than the sampling period described above. As a result, in some embodiments, the pixels 202 may be configured to simultaneously operate as a photon counting pixel and as a current integrating pixel. The pixels 202 may be configured to output a signal repressing a photon count to column line 104-1 and a signal representing an integrated value to column line 104-2.

The S/H 210 may be similar to the S/H 107 described above. The buffer is configured to buffer or amplify a signal from the S/H 210 and hence, a signal from the column line 104-2 from a selected pixel 202. Similar to the comparator 106 and the counter 108, the S/H 210 and the buffer 212 may be shared by the pixels 202 of the column 200. As a result, the pixel design may be simplified, the fill factor increase, or the like as described above with other sharing of circuitry.

In some embodiments, the integrated value and the photon count may be combined together. For example, dividing the integrated value with the photon count total would give the average energy of the beam. In another example, the integrated value and the photon count may be used for error detection or correction. That is, each of the integrated value and the photon count may be used to check whether the other is within a reasonable range. In a particular example, a combined estimate of the energy of the counted photons, a product of the photon count and an average energy of a photon, or the like may be comparted with the integrated value.

Figure 2B:
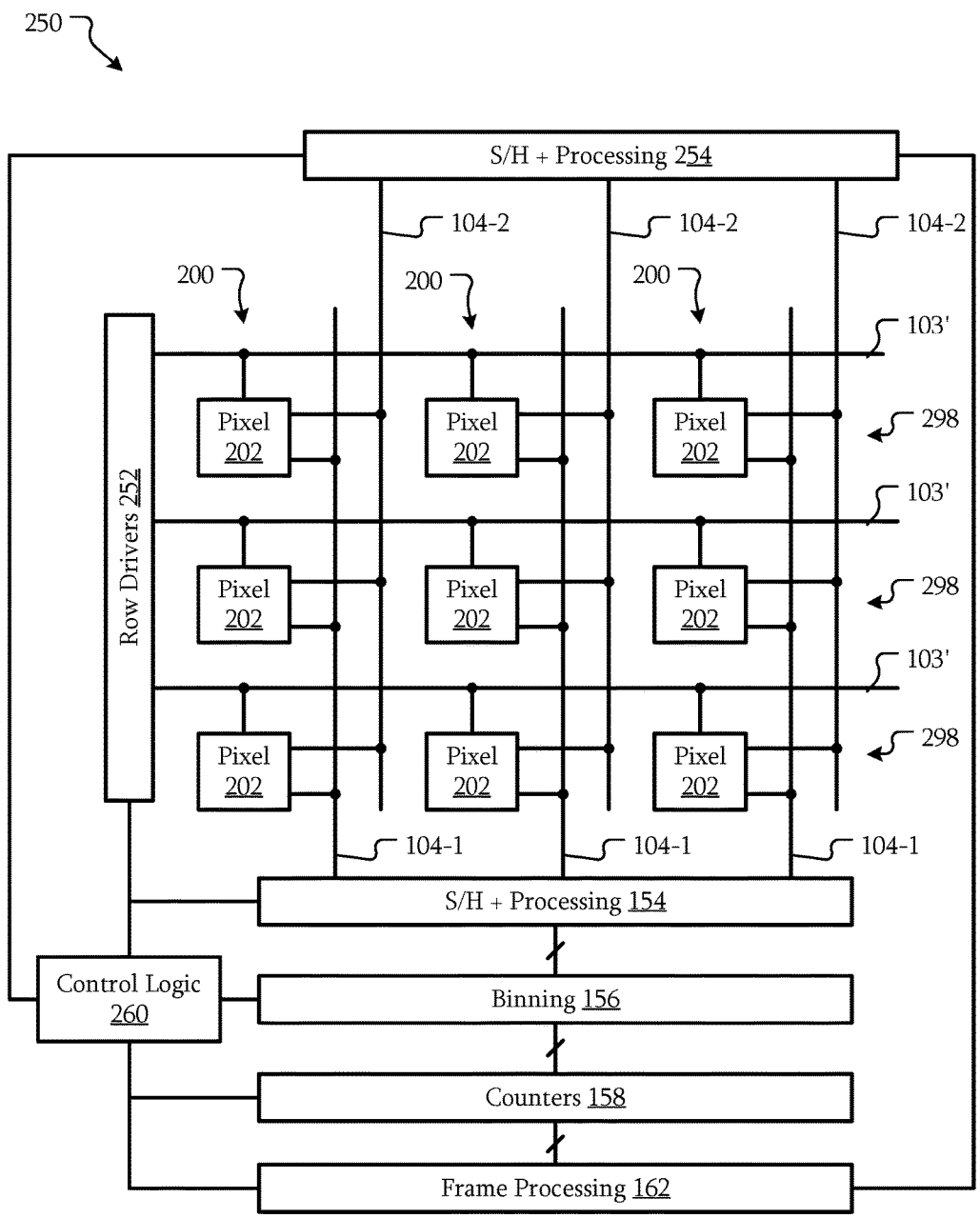
FIG. 2B is block diagram of a detector according to some embodiments.

FIG. 2B is block diagram of a detector according to some embodiments. A detector 250 may be similar to the detector 150 described above. However, the detector 250 includes pixels 202, each coupled to a column line 104-1 and 104-2. The column lines 104-2 are coupled to S/H and processing 254. The S/H and processing 254 may include the S/H 210 and buffer 212 described above. The S/H and processing 254 may include additional circuitry to or different circuitry from S/H 210 and buffer 212. The S/H and processing 254 may be coupled to the frame processing 162. As a result, the values output to column lines 104-2 may be incorporated into a frame.

The row drivers 252 are coupled to row select lines 103'. Each row select line 103' represents multiple individual lines for control signals to control the coupling of the pixels 202 of the corresponding row 298 to the column lines 104-1 and 104-2.

The control logic 260 is configured to control the row drivers 252 to selectively activate the row select lines 103'. In addition, the control logic is configured to control the S/H and processing 254.

Figure 3:
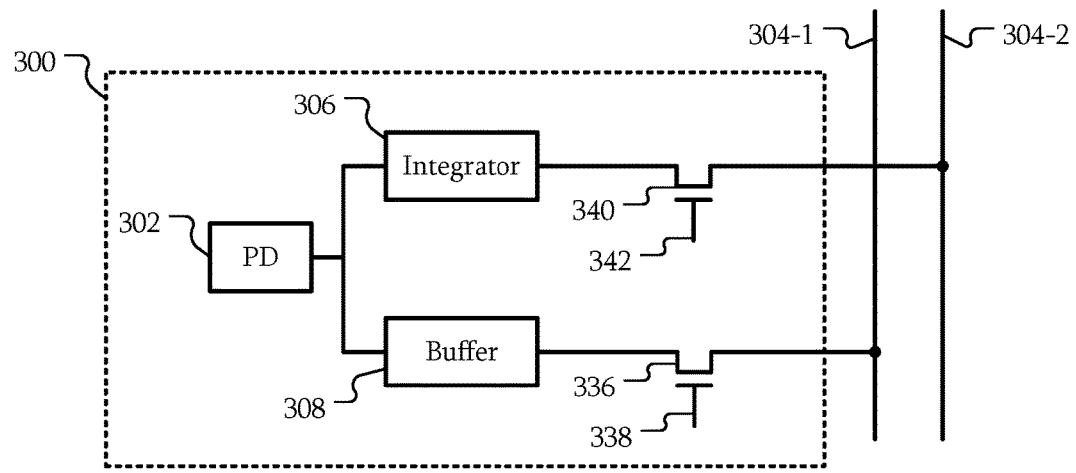
FIG. 3 is a block diagram of a pixel according to some embodiments.

FIG. 3 is a block diagram of a pixel according to some embodiments. A pixel 300 includes a PD 302, a buffer 308 coupled to the PD 302 and a first column line, 304-1, and an integrator 306 coupled to the PD 302 and the second column line 304-2. Readout transistors 336 and 340 are configured to selectively couple the buffer 308 and integrator 306 to the first and second column lines 304-1 and 304-2 in response to readout control signals 338 and 342, respectively. The pixel 300 is an example of a pixel that may be used in the detector of FIG. 2B. The PD 302, buffer 308, and readout transistor 336 may be similar to the PD 101, buffer 109, and readout transistor 136 described above. However, the pixel 300 includes the integrator 306.

The integrator 306 is coupled between the PD 302 and the column line 304-2. The integrator 306 is configured to integrate a signal from the PD 302 similar to a CID. As described above, a signal from PD 302 that is sampled using a sampling period as described above may output a signal that is representative of the energy of a single incident photon. The integrator 306 may be configured to integrate that signal over multiple sampling periods. That is, the integrator 306 may be configured to operate using a longer integration period. In some examples, the integration period is at least ten times greater than the sampling period. In other examples, the integration period is at least twenty or thirty times greater than the sampling period. Accordingly, as incident photons generate values during a sampling period of the pixel 300, the integrator 306 may add that value with a currently stored value within the integrator 306. That value may be maintained until another sampling period during which another photon is incident. The signal from that photon is again added to the value currently within the integrator 306.

Accordingly, a value stored in the integrator 306 and available to be output to the column line 304-2 may represent the integrated signals from multiple individual photons. However, the integrator 306 may also continue to operate even if multiple photons are incident during a single sampling period. For example, if two photons are incident on a pixel 300, the PD 302 may output a signal representative of the combined energy of the two photons. While this signal may be mistakenly interpreted by a comparator and counter as a high energy single photon, the integrator 306 may still accurately represent the collected signal charge.

Figure 4A:
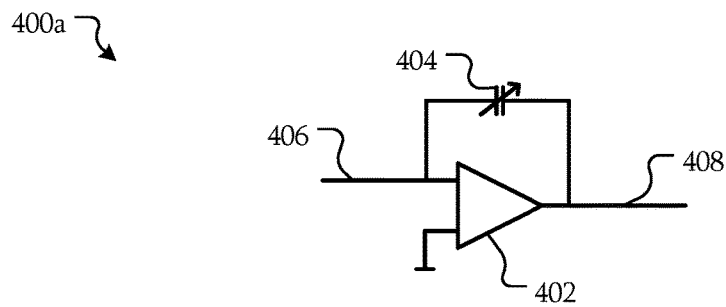
FIGS. 4A-4B are block diagrams of integrators of pixels according to some embodiments.
Figure 4B:
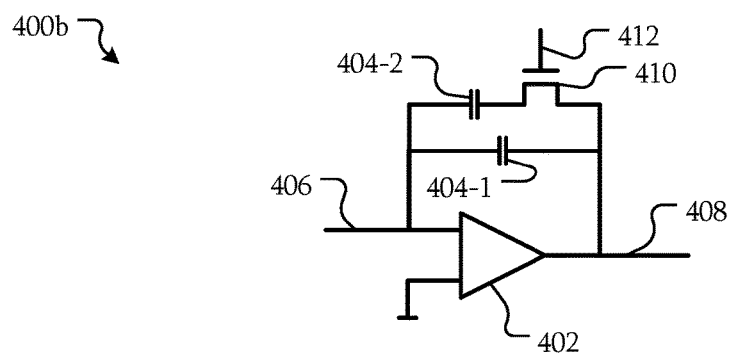

FIGS. 4A-4B are block diagrams of integrators 306 of pixels according to some embodiments. Referring to FIG. 4A, the integrator 400a includes an amplifier 402, a variable integration capacitor 404, an input 406 and output 408. The variable integration capacitor 404 is coupled between the input 406 and the output 408. The variable integration capacitor 404 may be used to select the gain of the integrator 400a.

Referring to FIG. 4B, the integrator 400b includes an amplifier 402, input 406 and output 408 similar to the integrator 400a. However, the feedback capacitance is formed by integration capacitor 404-1 in parallel with integration capacitor 404-2. Transistor 410 is coupled in series with integration capacitor 404-2. Accordingly, transistor 410 may selectively cause the capacitance of integration capacitor 404-2 to add to that of integration capacitor 404-1 in response to a control signal 412. As a result, the gain and dynamic range of the integrator 404b may be changed.

Although a particular configuration of a variable capacitance has been used as an example in FIG. 4B, in other embodiments, different techniques may be used. For example, multiple capacitor/transistor pairs may be coupled in parallel to give the integrator multiple values of feedback capacitance.

Although integrators with variable capacitors have been used as examples of the integrator 306, in other embodiments, the integrator 306 need not include a variable capacitor. For example, in some embodiments, the integrator 306 may have a fixed capacitor.

Figure 5:
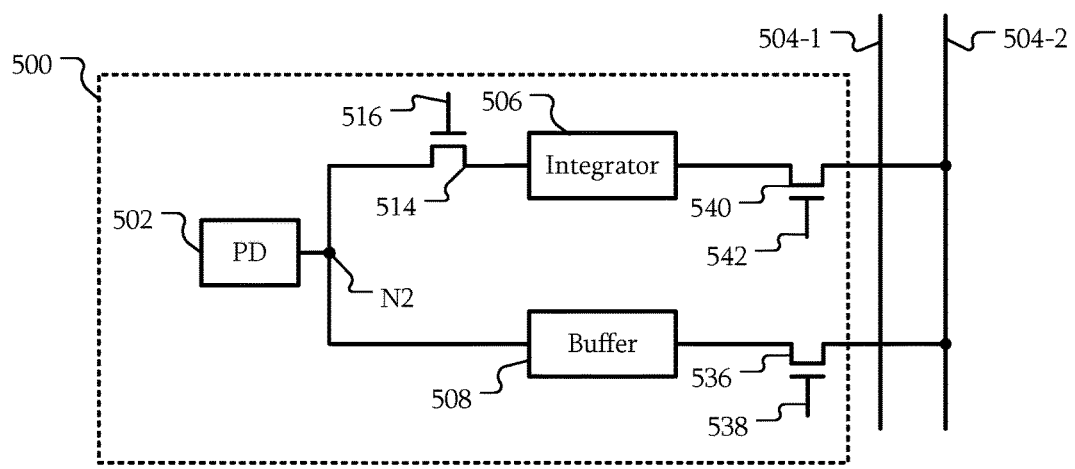
FIG. 5 is a block diagram of a pixel according to some embodiments.

FIG. 5 is a block diagram of a pixel according to some embodiments. In this embodiment, the pixel 500 may be similar to the pixel 300 of FIG. 3. For example, the PD 502, integrator 504, buffer 508, and couplings to the column lines 504-1 and 504-2 through readout transistors 536 and 540 may be similar to the corresponding components of the pixel 300.

However, in some embodiments, the pixel 500 includes an integrator transfer transistor 514. The integrator transfer transistor 514 is coupled between and input to the integrator 506 and a node N2 between the PD 502 and the buffer 508. The input to the buffer 508 is coupled to the node N2. The integrator transfer transistor 514 may be configured to selectively couple the integrator 506 to the node N2 in response to a transfer control signal 516.

Accordingly, in some embodiments, the integrator 506 may be controlled to integrate only during certain time periods. For example, in some embodiments, a comparator 106 described above may be used to compare the output of the buffer 508 of the pixel 500 to a threshold. If the output is greater than the threshold then the integrator transfer transistor 514 may be controlled by the transfer control signal 516 to conduct. As a result, the signal that resulted in the output being greater than the threshold may be integrated using the integrator 506. However signals that do not pass the threshold are not integrated. In a particular example, the threshold may be set to be above a signal generated by noise, dark current, or the like but below a signal generated by expected photons. As a result, the integrator does not integrate the noise, dark current, or the like. While such contributions may still be present when a photon is detected, the contribution of the noise, dark current, or the like to the integrated signal will be reduced.

Figure 6:
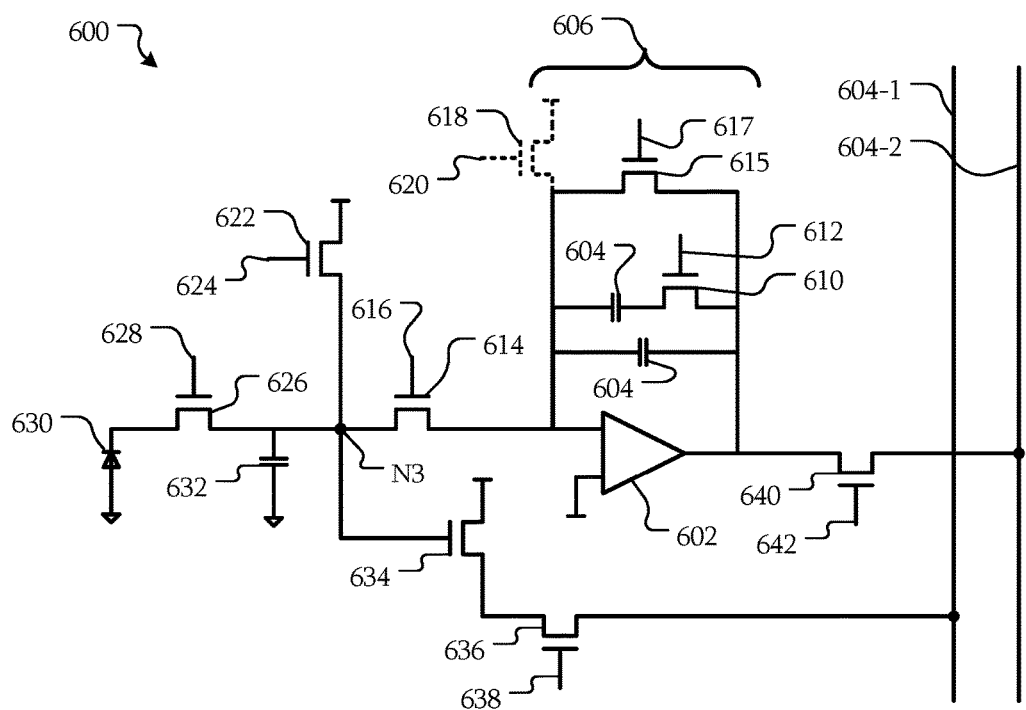
FIG. 6 is a schematic of a pixel according to some embodiments.

FIG. 6 is a schematic of a pixel according to some embodiments. In some embodiments, the pixel 600 includes a photodiode 630, transfer transistor 626 configured to receive a transfer control signal 628, storage capacitor 632, reset transistor 622 configured to receive a reset control signal 624, source-follower transistor 634, column line 604-1, and readout transistor 636 configured to receive a readout control signal 638 similar to the corresponding components of FIG. 1G. However, the pixel 600 also includes an integrator 606 with amplifier 602, integration capacitors 604, and gain transistor 610 configured to receive a gain select control signal 612 similar to the integrator 400b of FIG. 4B. The integrator 606 is coupled to the node N3 by integrator transfer transistor 614. Integrator transfer transistor 614 is configured to receive the transfer control signal 616 similar to the integrator transfer transistor 514 of FIG. 5. In addition, an integrator readout transistor 640 is coupled between the integrator and the column line 604-2. The integrator readout transistor 640 is configured to receive a readout control signal 642 and selectively couple an output of the integrator 606 to the column line 604-2. The readout control signal 642 may be a row select signal for the integrators 606 of a row. In some embodiments, an integrator reset transistor 615 configured to receive a reset control signal 617 is coupled to an input and output of the amplifier 602 to reset the integration capacitors 604.

In some embodiments, a second reset transistor 618 configured to receive a second reset control signal 620 is coupled to the integrator. The second reset transistor 618 may be used in addition to or instead of the reset transistor 622. For example, the integrator transfer transistor 614 and the second reset transistor 618 may be turned on to reset node N3.

In some embodiments, the photodiode 630 receives incident photons and generates a charge in response. After a sampling period, the collected charge can be transferred to the storage capacitor 632. This creates a change in voltage across the storage capacitor 632. The voltage of the storage capacitor 632 may be read out using the source follower 634 by connecting it to the column line 604-1 using the readout transistor 636 and the readout control signal 638. The voltage across the storage capacitor 632 can be reset destructively or nondestructively depending on the switching configuration. For example, if the integrator transfer transistor 614 is conducting while reset transistors 615 and 622 are open then the reset is nondestructive and the charge stored on the storage capacitor 632 is transferred to the integration capacitor(s) 604. However, if reset transistor 622 is conducting, then the charge is lost.

In some embodiments, when using a nondestructive reset, the charge from the storage capacitor 632 is transferred to the integration capacitor(s) 604 in each sampling reset cycle. The integrator 606 is operated on a longer time scale of at least two of the sampling periods. In a particular example, the signal on the node N3 can be read out at 1000 fps through the source follower 634. In contrast, the integrated signal at the output of the integrator 606 may be read out at 30 fps.

This arrangement allows for multiple modes of imaging. The portion of FIG. 6 similar to that of FIG. 1G, described above, allows for the operations described above. However, the addition of the integrator 606 allows for integrating over multiple sampling periods. For example, current integration can be implemented in multiple ways using the in-pixel integrator. A purely integrating detector can be implemented by closing transistor 614 and transistor 626. In this case, any current integrating at node N3 is captured by the integration capacitor(s) 604.

In some embodiments, the integrator 606 can be run concurrently with the source follower 634. As a result, the integration capacitor(s) 604 are charged when the node N3 is reset nondestructively through the transistor 614, producing a signal proportional to the time integral of all the signals readout by the readout transistor 636 during the integration time period. In some embodiments, the integration capacitor(s) 604 are chosen to be larger than the capacitance at node N3. This allows for larger signal storage and higher dynamic range in the integrator.

However, in other embodiments, the integration capacitor(s) 604 are equal to or smaller than the capacitance at node N3. For example, in some circumstances, capacitance at node N3 may be limited to a large value. In another example, the capacitance at node N3 may be smaller when the integrator 606 is used as a gain stage.

In some embodiments, the use of both the photon counting and the integration capabilities of the pixel and the column circuitry allows for higher dynamic range imaging (i.e., high and low dose imaging). Photon counting has better performance at low dose rates while integration performs better at high count rates in high dose applications. Additionally, using both imaging modes allows for image improvements. In one example, the signal from one mode can be used for error correction. Another example of an image improvement technique is the use of the output of the count system to determine the reset mode. If no counts are detected a destructive reset of node N3 is performed. However, after a count is detected, a nondestructive reset is performed by storing the signal on integration capacitor(s) 604. As a result, the dark current generated in empty frames is not integrated, reducing the noise of the integrating system. In yet another example, this system can also work as an average energy imaging system, which is a hybrid of photon counting and current integration. Photon counting gives the total number of photons incident on the pixel while current integration gives a value proportional to the total energy absorbed. Dividing the integrated output with the photon count total would give the average energy of the beam. This approach can be useful in applications such as contrast enhanced imaging. In addition, the energy bins from the counting system also contain similar information that can be used to improve image quality. Moreover, the combination of photon counting and current integration helps bridge the gap between photon counting and integration systems both in performance, as stated above, and in technology adoption. The combination of the two techniques helps alleviate any 'dose rate anxiety' that users may have in adopting pure photon counting systems due to their limited count rate performance by adding the integration system. Anxiety due to potential saturation of the photon counting system may be alleviated by having the additional integration system.

Figure 7:
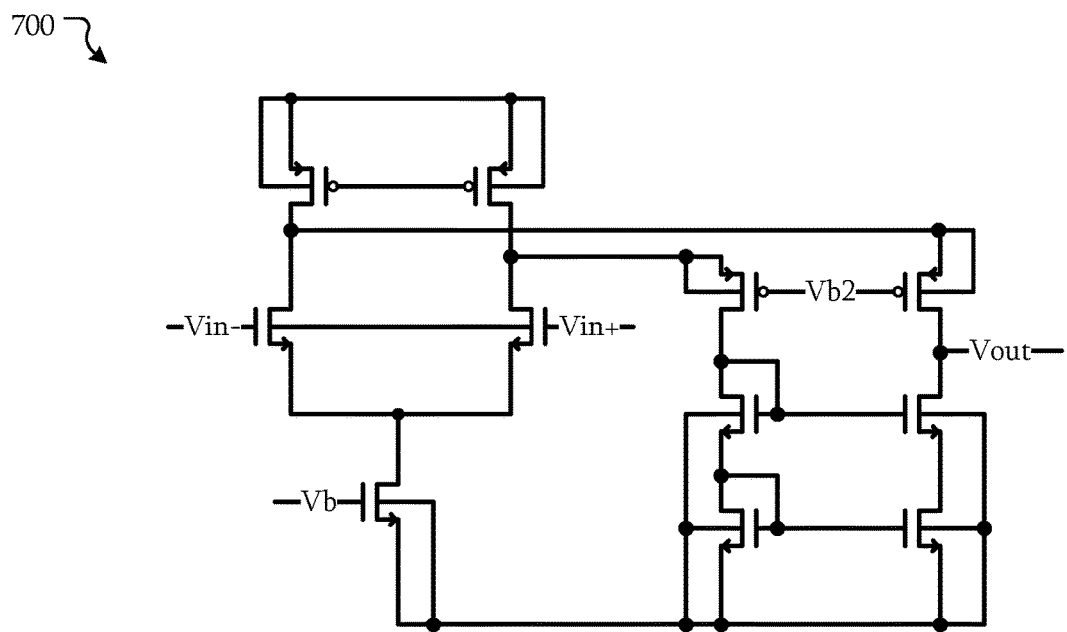
FIG. 7 is a schematic of an amplifier of an integrator according to some embodiments.

FIG. 7 is a schematic of an amplifier of an integrator according to some embodiments. In some embodiments, the amplifying circuit 700 may be used as an amplifier 402, 602, or the like described above. The amplifying circuit 700 may include various types and configurations of transistors, such as n-type and p-type transistors. The circuit 700 is a folded cascode amplifier. A cascode amplifier is a two-stage amplifier that consists of a common-emitter stage feeding into a common-base stage. A folded cascode amplifier is a cascode amplifier with a "folding" about the cascade node (node between the common-emitter stage and the common-base stage, which can increase the input and output swing range. While a folded cascode amplifier has been used as an example, in other embodiments, different amplifier topologies may be used.

Figure 8A:
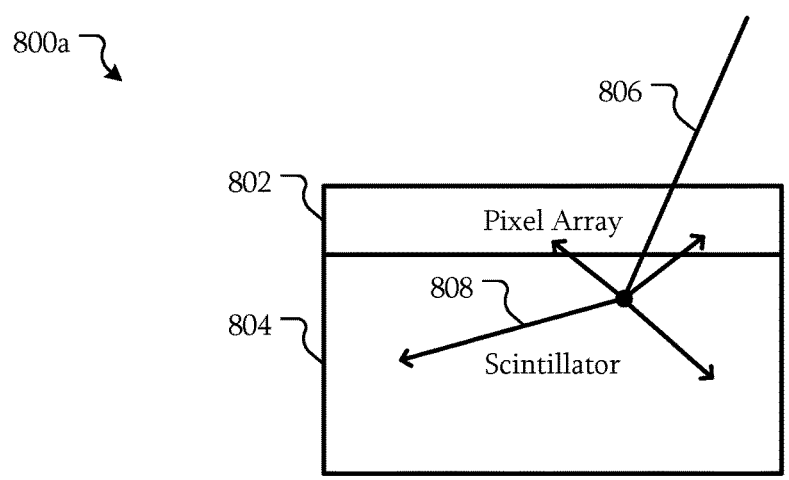
FIGS. 8A-8C are block diagrams of detectors according to some embodiments.
Figure 8B:
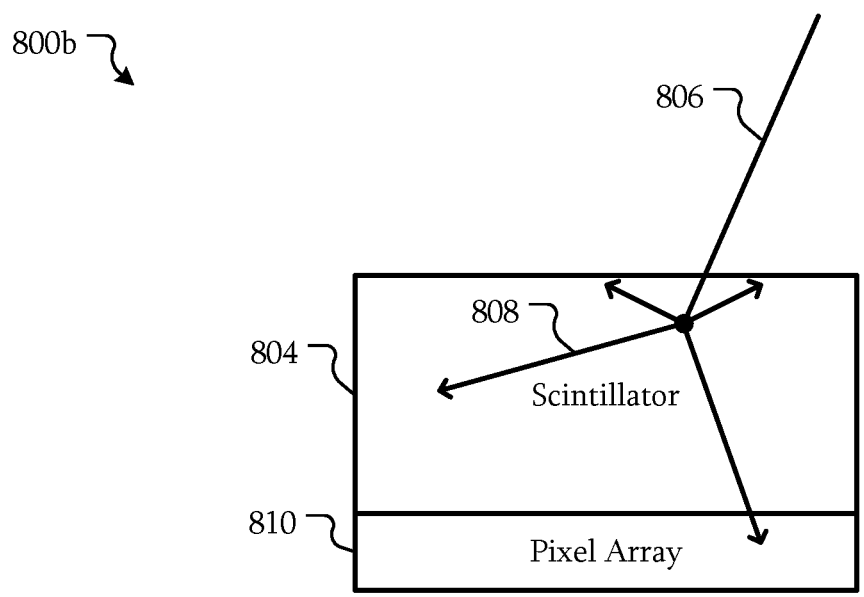
Figure 8C:
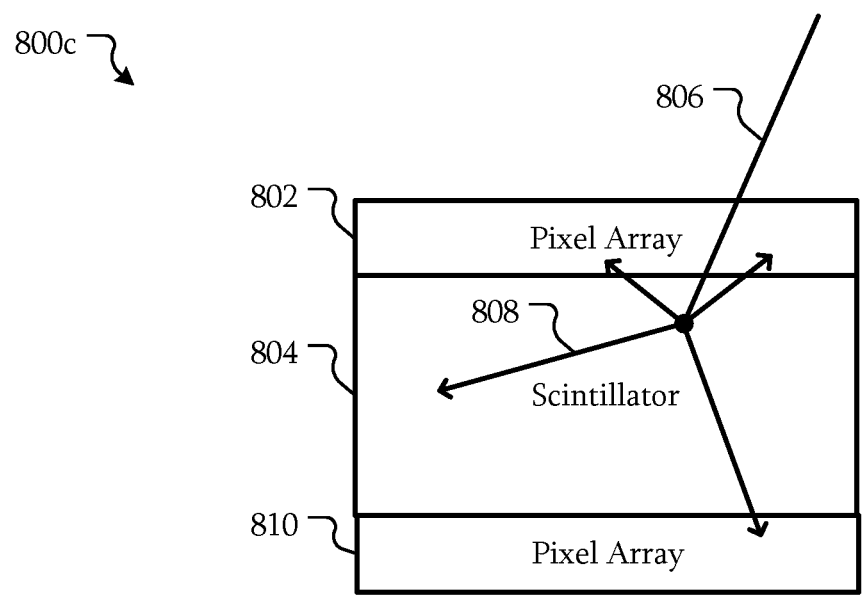

FIGS. 8A-8C are block diagrams of detectors according to some embodiments. In some embodiments, a pixel array 802 of a detector 800a, such as those described above, may be mounted on a scintillator 804. The scintillator 804 is configured to convert incoming photons, such as x-ray photons, into photons having different energy. For example, the scintillator 804 may include cesium iodide (CsI), cesium iodide thallium (CsI:Tl), gadolinium oxisulfide ($Gd_2O_2S$: Tb), cadmium tungstate ($CdWO_4$), bismuth germanate ($Bi_4Ge_3O_{12}$ or BGO), or other materials. CsI:Tl and $Gd_2O_2S$ have high scintillator gain and a relatively fast response. Ray 806 represents an incoming x-ray photon and rays 808 represent possible photons, such as visible light photons, generated by scintillation.

In some embodiments, using a silicon-based semiconductor for the pixel array 802 may improve performance. In particular, silicon has a relatively lower x-ray absorption coefficient. As a result, there may be less signal corruption from the absorption of stray x-ray photons in the silicon. Moreover, using the pixel array 802 on the top surface or incident surface of the detector 800a enables a different operation than having the pixel array 802 on the bottom surface or back surface. In particular, the lower x-ray absorption coefficient of silicon means that the signal will not be deteriorated as much by the silicon pixel array 802. In addition, the collection efficiency of the detector is improved. This improvement is due to the absorption of x-ray photons in matter. The lower energy photons have a higher absorption coefficient and are typically absorbed near the top of a scintillator 804. The smaller amount of scintillation produced by the lower energy photons will have to traverse a longer distance through the scintillator 804 to reach a pixel array 802 on the bottom or back surface. A signal from such a source may be smaller. However, with the pixel array 802 being disposed on the top or incident surface, the lower energy photons are absorbed closer to the pixel array 802, thus less signal is lost in the scintillator 804. While the higher energy photons are absorbed further away from the pixel array 802, the higher energy x-rays produce a larger scintillation signal thus even if they suffer some deterioration, the amount of signal that makes it to the pixel array 802 may still be large enough.

Referring to FIG. 8B, in some embodiments, the detector 800b may be similar to the detector 800a. However, the pixel array 810 of detector 800b is disposed on bottom or back surface of the scintillator 804.

Referring to FIG. 8C, in some embodiments, a detector 800c includes pixel arrays 802 and 810 disposed on the scintillator 804 similar to both detectors 800a and 800b. In this configuration, the performance of the detector 800c may be relatively improved. As described above, the pixel array 802 may have a greater detection efficiency for lower energy photons than the pixel array 810. The pixel array 810 may have a greater detection efficiency for higher energy photons. Accordingly, the outputs of the pixel arrays 802 and 810 may be combined, taking advantage of the benefits of detectors in both positions. In a particular example, the output of the pixel array 802 may be used for low energy detection. The output of the pixel array 810 may be used for high energy detection.

Figure 9A:
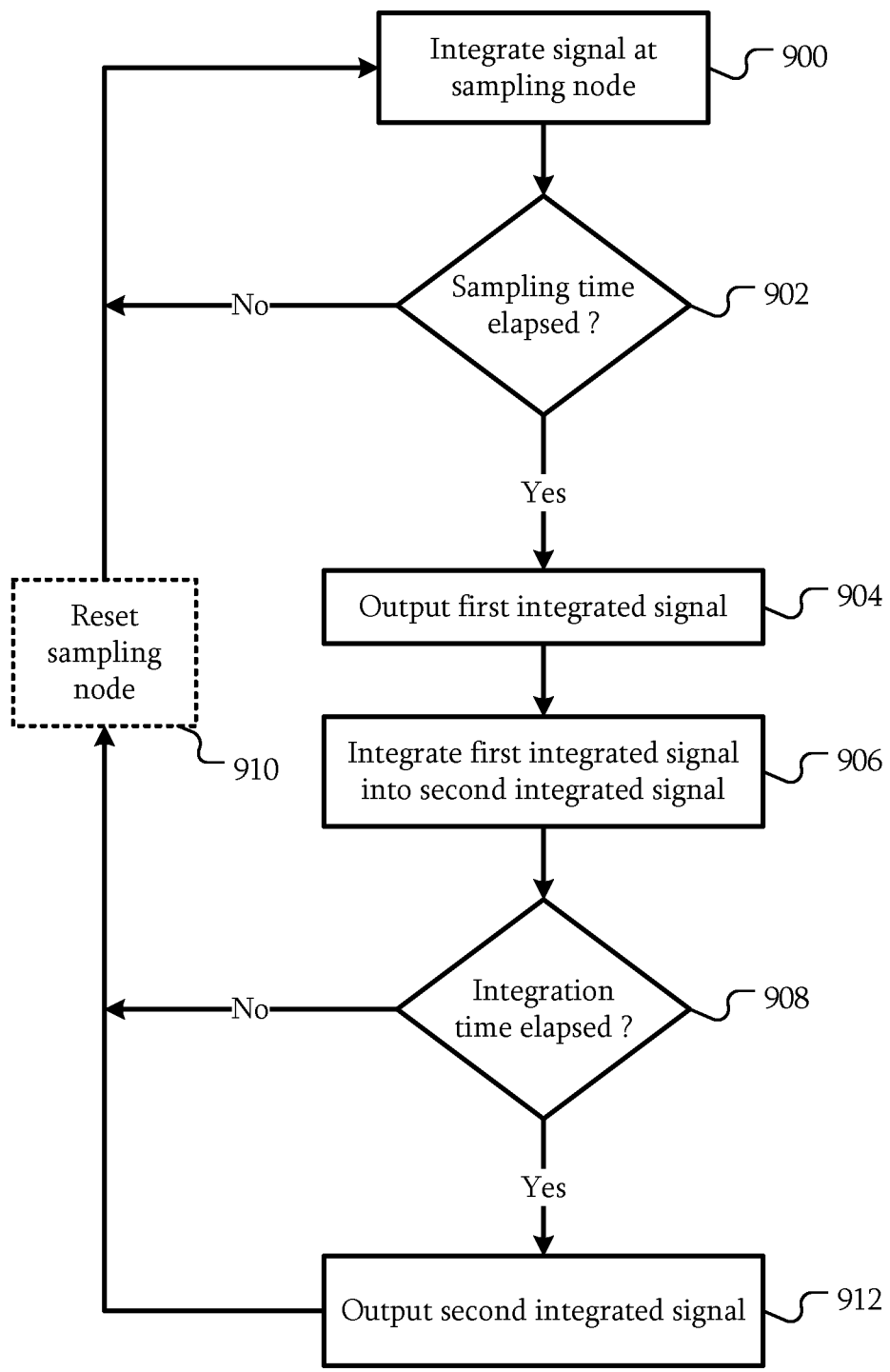
FIGS. 9A-9B are flowcharts of techniques of operating a pixel according to some embodiments.
Figure 9B:
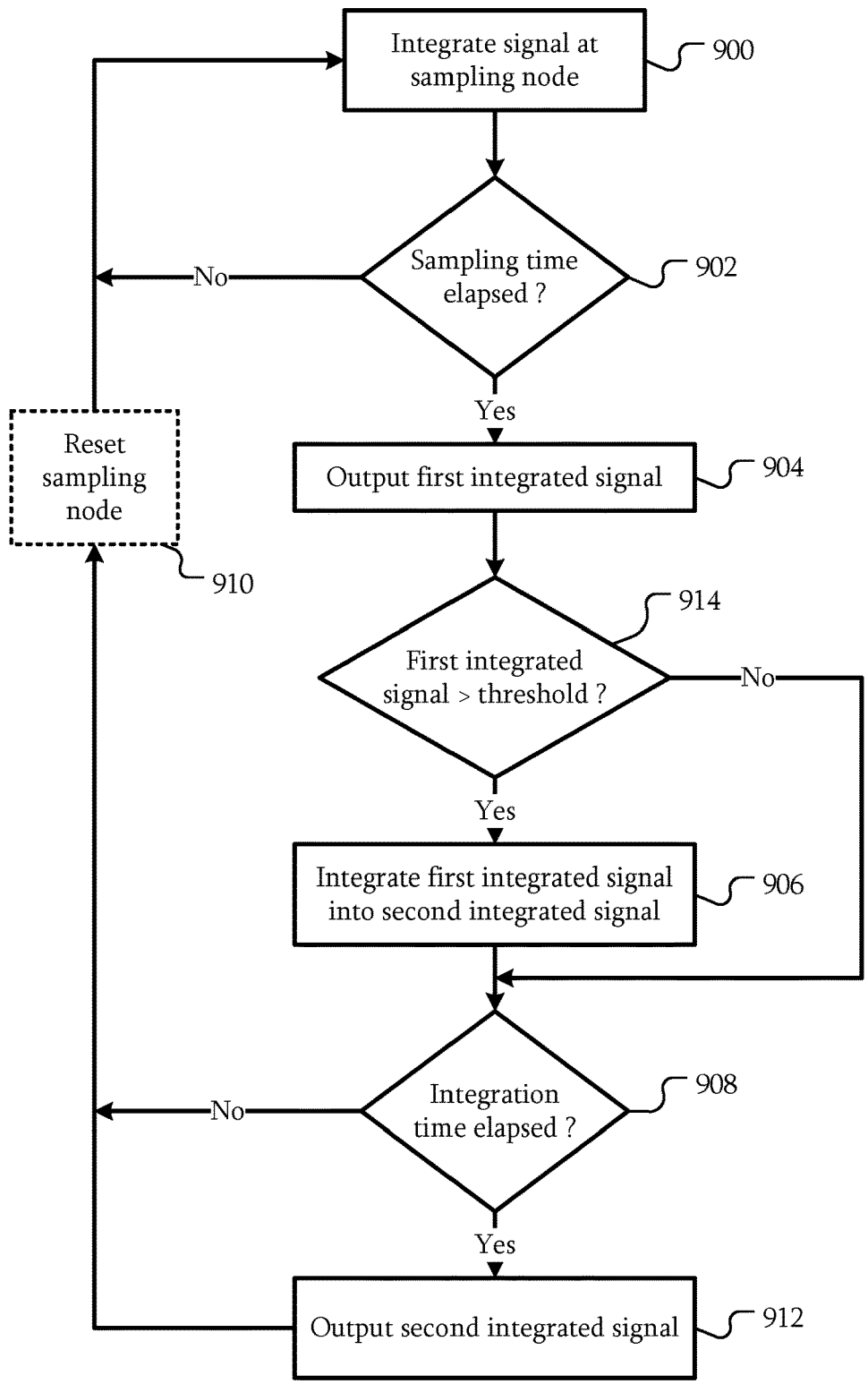

FIGS. 9A-9B are flowcharts of techniques of operating a pixel according to some embodiments. Referring to FIG. 9A, in 900 a signal is integrated at a sampling node, generating a first integrated signal. Using FIG. 6 as an example, a signal may be integrated at node N3 due to an incident photon. Control logic, such as control logic 260, may generate the transfer control signal 628 to couple the photodiode 630 to node N3. In some embodiments, the sampling node may be a node coupled to the photodiode 630. Control logic may generate the transfer control signal 628 to couple the photodiode 630 to the node N3 at a later time.

In 902 it is determined if a sampling time has elapsed. For example, the control logic may maintain a timer for the pixel, a row containing the pixel, and/or an array of pixels. If the timer has not expired indicating that the sampling time has not elapsed, the integration continues in 900.

In 904, if the sampling time has elapsed, the integrated signal is output as a first integrated signal. For example, transistor 626 may be turned on by transfer control signal 628, if it was not already on before, and transistor 636 may be turned on by readout control signal 638. As a result, the signal on node N3 is output to the column line 604-1 through the source follower 634. The first integrated signal may be compared to one or more thresholds, used to increment one or more counters, or the like as described above.

In 906, the first integrated signal is integrated into a second integrated signal. For example, transistor 614 may be turned on by control signal 616. As a result, the signal on node N3 is integrated in the integrator 606. In some embodiments, the transistor 614 is turned on when integrating the first integrated signal. Thus the second integrated signal is integrated at the same time. However, in other embodiments, the integration of the second integration signal may be performed at the end of the sampling time. The first integrated signal integrated into a second integrated signal may also reset the storage capacitor 632.

As a result, a signal was integrated over a sampling period and output as a first integrated signal. A second signal was integrated, but not necessarily output at the end of the sampling period. In 908, it is determined if an integration time has elapsed. Similar to the sampling period, the integration time may be monitored by the control logic 260. If the integration time has not elapsed, the integration in 900 for a new sampling period begins again in 900. In some embodiments, the sampling node is reset in 910 prior to the new sampling period. In some embodiments, the sampling node is reset as part of the integration in 906. As a result, the operations described above may repeat, causing the second integrated signal to be changed in 906 by a new first integrated signal acquired during a new sampling period.

However, if the integration time has elapsed, in 912, the second integrated signal is output to the column line 604-2 and the integrator 606 is reset using the integrator reset transistor 615 or the second reset transistor 618. As a result integration time for the second integrated signal covers multiple sampling periods. For example, the ratio of integration time to sampling period may be at least 30. In other examples, the ratio of integration time to sampling period may be at least 300. However, in other embodiments, different ratios of integration to sampling time may be used.

Referring to FIG. 9B, in some embodiments, the first integrated signal may be compared with a threshold in 914. If the first integrated signal does not exceed the threshold, the integration of the first integrated signal into the second integration signal in 906 may not be performed. As described above, this may reduce the contribution of noise, dark current, or the like to the second integrated signal.

Figure 10:
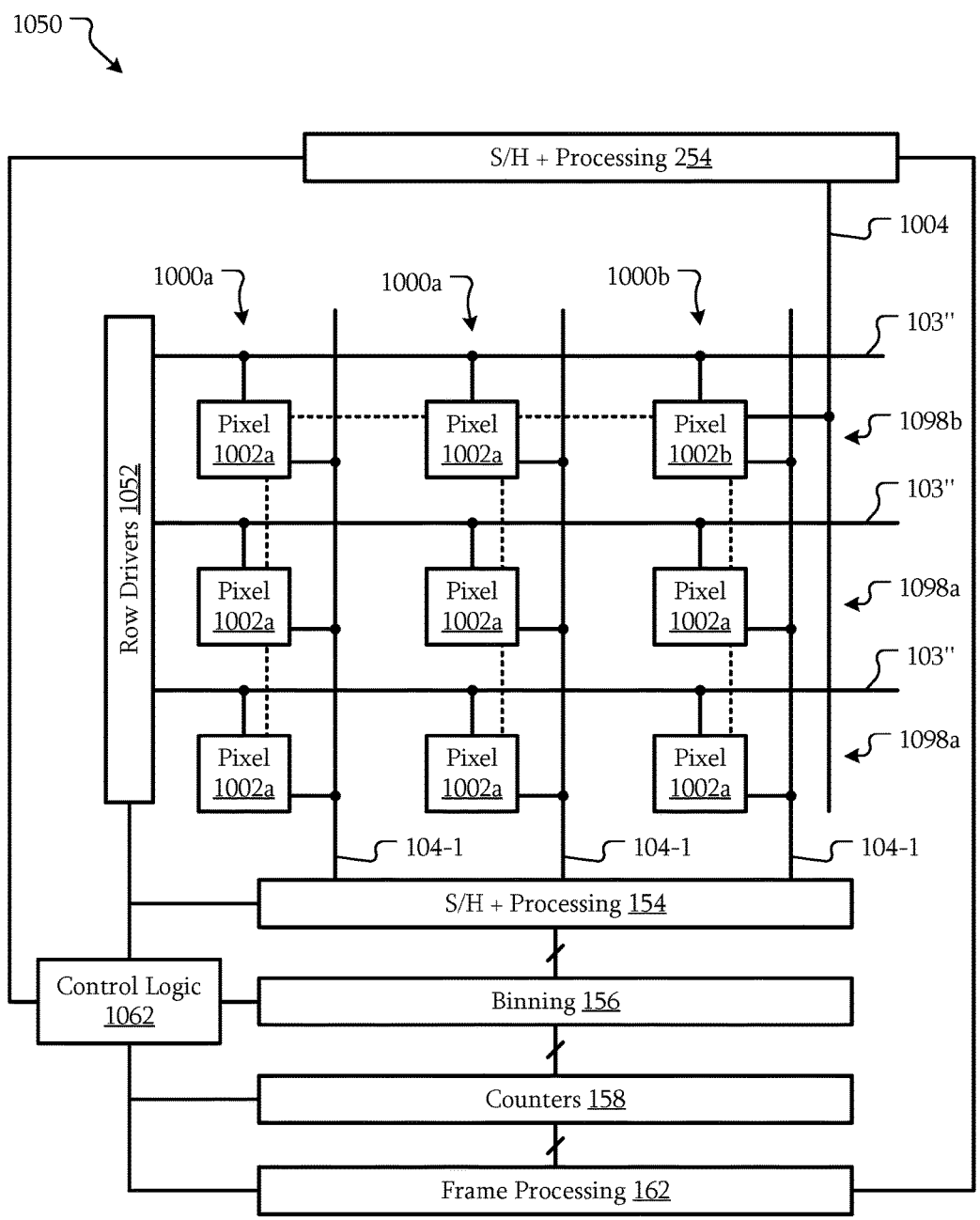
FIG. 10 is a block diagram of a detector with pixel binning according to some embodiments.

In some embodiments, pixel binning may be used to integrate the values of multiple pixels. FIG. 10 is a block diagram of a detector with pixel binning according to some embodiments. The detector 1050 includes components similar to detector 250 of FIG. 2B. However, the integration of signals from the pixels 1002 is performed differently. In particular, columns 1000a include pixels 1002a. Pixels 1002a may be similar to pixels described above with respect to FIGS. 1A-1H. That is, the pixels 1002a do not have integrators. Column 1000b includes pixels 1002a, but also includes a pixel 1002b in row 1098b. Pixel 1002b includes and integrator similar to pixels described above with respect to FIGS. 2A-6. The dashed lines between the pixels 1002a and 1002b represent a connection between a sensing or storage node of the pixel 1002a and the integrator of the pixel 1002b. Transistors similar to the integrator transfer transistors 514 or 614 may selectively couple the sensing or storage node of the pixels 1002a to the integrator of pixel 1002b. Accordingly, the integrator of pixel 1002b may integrate signals generated in response to multiple pixels.

As one integrator is used for multiple pixels, a different number of second column lines 1004 may be used. In this example, a 3×3 array of pixels are coupled to the integrator of pixel 1002b. Accordingly, only pixel 1002b has a connection to the second column line 1004.

Although the integrator has been described as being part of a pixel 1002b, in other embodiments, the integrator may be separate. For example, each pixel may be a pixel 1002a and have a connection from its storage or sampling node to the separate integrator.

Although a 3×3 array has been used as an example of the number of pixels that share an integrator, other sizes of arrays may be used. For example, in some embodiments, a 1×k array of k pixels may be disposed in columns similar to column 1000b. In another example, a k×1 array of k pixels may be disposed in rows similar to row 1098b.

The row drivers 1052 and control logic 1062 may be configured to activate the row select lines 103" to accommodate the different output of the pixels 1002a and 1002b. For example, the row select lines 103" may be controlled so that pixels 1002a and 1002b of the two rows 1098a and the row 1098b are activated to output signals to the S/H and processing 154 as described above. In addition, the row select lines 103" may be activated to integrate the signal from each of the pixels of the array. Once the integration is complete, the integrated signal may be output to the column line 1004.

Referring to FIGS. 1A-1H, some embodiments include a device, comprising: a column line 104; a plurality of pixels 102 configured to capture energy from photons; each pixel 102 coupled to the column line 104; a comparator 106 having an input coupled to the column line 104 and configured to compare a signal from the column line 104 to a threshold; and control logic 160 coupled to the pixels 102 and configured to selectively couple each pixel 102 to the column line 104 after a sampling period for each pixel 102.

In some embodiments, the comparator 106 is one of a plurality of comparators 106 or an analog-to-digital converter (ADC) 111 coupled to the column line 104 and configured to compare the signal from the column line 104 to a corresponding threshold; and the device further comprises a plurality of counters 108, each counter 108 coupled to an output of a corresponding one of the comparators 106 or the analog-to digital converter 111.

Referring to FIGS. 2A-2B, in some embodiments, the column line 104 is a first column line 104-1; and the device further comprises a second column line 104-2; and each pixel 202 is coupled to the second column line 104-2.

Referring to FIG. 3, in some embodiments, each pixel 300 comprises: a photoelectric conversion device 302; a buffer 308 coupled to the photoelectric conversion device 302 and the first column line 304-1; and an integrator 306 coupled to the photoelectric conversion device 302 and the second column line 304-2.

Referring to FIGS. 4A-4B, in some embodiments, for each pixel, the integrator 400a comprises a variable capacitor 404 having a capacitance selectable from among a plurality of values.

Referring to FIG. 5, in some embodiments, each pixel 500 further comprises: a node N2; and a first transistor 514 coupled between the node N2 and an input of the integrator 506; wherein: an input to the buffer 508 is coupled to the node N2; and the photoelectric conversion device 502 is coupled to the node N2.

Referring to FIG. 6, in some embodiments, the device further comprises a second transistor 626 coupled between the node N3 and the photoelectric conversion device 630 and between the photoelectric conversion device 630 and the input of the buffer 634.

In some embodiments, the device further comprises a capacitor 632 coupled in parallel with the photoelectric conversion device 632 wherein the second transistor 626 is coupled between the capacitor 632 and the photoelectric conversion device 630.

In some embodiments, the device is a monolithic integrated circuit.

Referring to FIGS. 8A-8C, in some embodiments, the device further comprises a scintillator 804 having a front surface configured to receive incoming photons and a back surface opposite the back surface; wherein the pixels 802 are disposed on the front surface.

In some embodiments, the pixels are first pixels of a first pixel array 802; and the device further comprises a second pixel array 810 disposed on the back surface of the scintillator 804.

Referring to FIG. 10, in some embodiments, the device further comprises an integrator 506 coupled to at least two pixels 1002 of the plurality of pixels 1002 and configured to integrate a signal from each of the at least two pixels 1002.

Some embodiments include a method, comprising: acquiring a signal from a photoelectric conversion device 302 of a pixel 300 during a sampling time period; incrementing a counter 108 based on the signal; resetting the acquiring of the signal after the sampling time period; and integrating the signal over multiple sampling time periods.

In some embodiments, integrating the signal comprises integrating the signal only if the counter 108 is incremented.

In some embodiments, acquiring the signal comprises acquiring the signal to a node N3; and the method further comprises destructively resetting the node when the counter 108 is not incremented.

In some embodiments, the method further comprises combining the integrated signal and an output of the counter 108.

In some embodiments, the method further comprises: acquiring a second signal from the photoelectric conversion device 101 during a second sampling time period; and incrementing the counter 108 based on the second signal.

Examples of the means for integrating a signal from a photoelectric conversion device over a first time period to generate a first integrated signal include portions of the pixel of FIG. 1G that may store a charge on node N1, portions of the pixel of FIG. 5 that may store a charge on node N2, portions of the pixel of FIG. 6 that may store a charge on node N3, and associated control lines and control circuitry such as the control logic described above.

Examples of the means for integrating the first integrated signal over a second time period to generate a second integrated signal include the integrators 306, 400a, 400b, 506, and 606.

Examples of the means for controlling the first and second time periods such that the first time period is shorter than the second time period include the control logic described above and associated control lines for control signals.

Examples of the means for counting based on the first integrated signal and the second integrated signal include the comparators, counters, the control logic and associated control lines for control signals, and the column lines described above.

Examples of the means for counting based on a comparison of the first integrated signal and a first threshold include the comparators, counters, the control logic and associated control lines for control signals, and the column lines described above.

Examples of the means for counting based on a comparison of the first integrated signal and a second threshold different from the first threshold include the comparators, counters, the control logic and associated control lines for control signals, and the column lines described above.

Although the structures, devices, methods, and systems have been described in accordance with particular embodiments, one of ordinary skill in the art will readily recognize that many variations to the particular embodiments are possible, and any variations should therefore be considered to be within the spirit and scope disclosed herein. Accordingly, many modifications may be made by one of ordinary skill in the art without departing from the spirit and scope of the appended claims.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claim 1, 2, or 3, with these separate dependencies yielding three distinct embodiments; claim 5 can depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed to cover the corresponding structure, material, or acts described herein and equivalents thereof in accordance with 35 U.S.C. § 112 ¶6. Embodiments of the invention in which an exclusive property or privilege is claimed are defined as follows.

The invention claimed is:

1. A device, comprising:
a first column line;
a second column line;
a plurality of pixels configured to capture energy from photons; each pixel coupled to the first column line and the second column line and comprising:
a node;
a first transistor;
a photoelectric conversion device coupled to the node through the first transistor;
a buffer coupled between the node and the first column line; and
an integrator coupled between the node and the second column line;
a comparator having an input coupled to the first column line and configured to compare a signal from the first column line to a threshold; and
control logic coupled to the pixels and configured to selectively couple each pixel to the first column line after a sampling period for each pixel.

2. The device of claim 1, wherein:
the comparator is one of a plurality of comparators or an analog-to-digital converter (ADC) coupled to the first column line and configured to compare the signal from the first column line to a corresponding threshold; and
the device further comprises a plurality of counters, each counter coupled to an output of a corresponding one of the comparators or the analog-to digital converter.

3. The device of claim 1, wherein for each pixel, the integrator comprises a variable capacitor having a capacitance selectable from among a plurality of values.

4. The device of claim 1, wherein each pixel further comprises:
a second transistor coupled between the node and an input of the integrator.

5. The device of claim 4, further comprising a capacitor coupled in parallel with the photoelectric conversion device wherein the first transistor is coupled between the capacitor and the photoelectric conversion device.

6. The device of claim 4, wherein:
each pixel further comprises a third transistor and a fourth transistor; and
for each pixel:
the integrator comprises an amplifier having an input coupled to the node through the second transistor and an output coupled to the second column line through the third transistor;
the buffer comprises a source follower having an input coupled to the node and an output coupled to the first column line through the fourth transistor.

7. The device of claim 1, wherein the device is a monolithic integrated circuit.

8. The device of claim 1, further comprising:
a scintillator having a front surface configured to receive incoming photons and a back surface opposite the front surface;
wherein the pixels are disposed on the front surface.

9. The device of claim 8, wherein:
the pixels are first pixels of a first pixel array; and
the device further comprises a second pixel array disposed on the back surface of the scintillator.

10. The device of claim 1, wherein for each pixel:
the integrator is configured to output an integrated signal to the second column line.

11. A method, comprising:
acquiring a signal from a photoelectric conversion device of a pixel during a sampling time period;
incrementing a counter based on the signal;
resetting the acquiring of the signal after the sampling time period; and
integrating the signal over multiple sampling time periods into a single integrated signal.

12. The method of claim 11, wherein integrating the signal comprises integrating the signal only if the counter is incremented.

13. The method of claim 11, wherein:
acquiring the signal comprises acquiring the signal to a node; and the method further comprises destructively resetting the node when the counter is not incremented.

14. The method of claim 11, further comprising combining the integrated signal and an output of the counter.

15. The method of claim 11, further comprising:
acquiring a second signal from the photoelectric conversion device during a second sampling time period; and
incrementing the counter based on the second signal.

16. The method of claim 11, further comprising:
buffering the signal during the sampling time period;
wherein incrementing the counter comprises incrementing the counter based on the buffered signal.

17. The method of claim 11, wherein incrementing the counter comprises incrementing at least one of a plurality of counters associated with the photoelectric conversion device based on the signal.

18. A device, comprising:
means for integrating a signal from a photoelectric conversion device of a pixel over a first time period to generate a first integrated signal;
means for integrating the first integrated signal over a second time period to generate a second integrated signal; and
means for controlling the first and second time periods such the second time period spans multiple first time periods.

19. The device of claim 18, further comprising:
means for integrating a second signal from a second photoelectric conversion device of a second pixel during the first time period; and
means for counting based on the first integrated signal and the second integrated signal.

20. The device of claim 18, further comprising:
means for counting based on a comparison of the first integrated signal and a first threshold; and
means for counting based on a comparison of the first integrated signal and a second threshold different from the first threshold.

* * * * *